(12) United States Patent
Jung et al.

(10) Patent No.: US 8,377,572 B2
(45) Date of Patent: Feb. 19, 2013

(54) POLYMER AND ORGANIC PHOTOELECTRIC DEVICE INCLUDING THE SAME

(75) Inventors: Sung-Hyun Jung, Gunpo-si (KR); Hyung-Sun Kim, Uiwang-si (KR); Ho-Jae Lee, Yongin-si (KR); Eun-Sun Yu, Anyang-si (KR); Mi-Young Chae, Yongin-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 171 days.

(21) Appl. No.: 12/659,798

(22) Filed: Mar. 22, 2010

(65) Prior Publication Data
US 2010/0176718 A1 Jul. 15, 2010

Related U.S. Application Data

(63) Continuation of application No. PCT/KR2008/005596, filed on Sep. 22, 2008.

(30) Foreign Application Priority Data

Sep. 21, 2007 (KR) .......... 10-2007-0096669

(51) Int. Cl.
*H01L 51/54* (2006.01)
*C09K 11/06* (2006.01)

(52) U.S. Cl. ........ 428/690; 428/917; 313/504; 528/423; 257/40

(58) Field of Classification Search .............. None
See application file for complete search history.

(56) References Cited

U.S. PATENT DOCUMENTS

| | | | | |
|---|---|---|---|---|
| 6,361,887 | B1* | 3/2002 | Shi et al. ............. | 428/690 |
| 7,189,877 | B2 | 3/2007 | Nishiyama et al. | |
| 2002/0182439 | A1 | 12/2002 | Tao et al. | |
| 2004/0202892 | A1* | 10/2004 | Yasuda et al. ......... | 428/690 |
| 2005/0119491 | A1* | 6/2005 | Iraqi et al. ........... | 548/444 |
| 2007/0031699 | A1* | 2/2007 | Yamada et al. ......... | 428/690 |
| 2007/0093643 | A1 | 4/2007 | You et al. | |

FOREIGN PATENT DOCUMENTS

| | | |
|---|---|---|
| JP | 2000104057 A * | 4/2000 |
| JP | 2004-315495 A | 11/2004 |
| JP | 2005-078217 A | 3/2005 |
| JP | 2005-171053 A | 6/2005 |
| JP | 2006-056821 A | 3/2006 |
| JP | 2007/091934 A | 4/2007 |
| JP | 2007-254297 A | 10/2007 |
| KR | 10 2005-0078211 A | 8/2005 |
| KR | 10-2007-0017733 A | 2/2007 |
| WO | WO 2005/073337 A1 | 8/2005 |

OTHER PUBLICATIONS

Machine translation of JP2000-104057. Date of publication: Apr. 11, 2000.*
Baldo, M.A., "Very high-efficiency green organic light-emitting devices based on electrophosphorescence", Appl. Phys. Letters, 75(1):4-6 (Jul. 5, 1999).
O'Brien, D.F., et al., "Improved energy transfer in electrophosphorescent devices", Appl. Phys. Letters, 74(3):442-444 (Jan. 18, 1999).
Tang, C.W., et al., "Organic electroluminescent diodes", Appl. Phys. Letters, 51(12):913-915 (Sep. 21, 1987).
Shih, Ping-I, et al., "Novel Carbazole/Fluorene Hybrids: Host Materials for Blue Phosphorescent OLEDs," *Organic Letters*, vol. 8, No. 13, 2006, pp. 2799-2802.
Extended European Search Report issued in corresponding application, EP 08 83 2006, dated Sep. 22, 2011.

* cited by examiner

*Primary Examiner* — Jennifer Chriss
*Assistant Examiner* — Andrew K Bohaty
(74) *Attorney, Agent, or Firm* — Lee & Morse, P.C.

(57) ABSTRACT

A polymer represented by the following Formula 1:

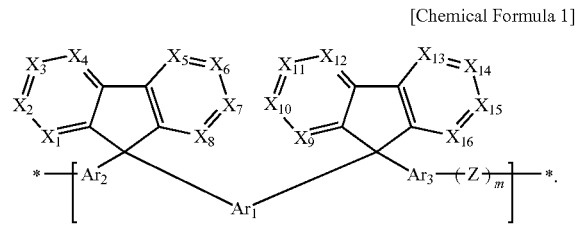

[Chemical Formula 1]

14 Claims, 3 Drawing Sheets

POLYMER AND ORGANIC PHOTOELECTRIC DEVICE INCLUDING THE SAME

CROSS-REFERENCE TO RELATED APPLICATION

This application is a continuation of pending International Application No. PCT/KR2008/005596, entitled "Polymer, and Organic Photoelectric Device Comprising the Same," which was filed on Sep. 22, 2008, the entire contents of which are hereby incorporated by reference.

BACKGROUND

1. Field

Embodiments relate to a polymer and an organic photoelectric device including the same.

2. Description of the Related Art

An organic photoelectric device has been highlighted as the next-generation display device. The organic photoelectric device may be driven at a low voltage, and may afford advantages not provided by a liquid crystal display (LCD), e.g., a small thickness, a wide viewing angle, and a rapid response speed. The organic photoelectric device of a middle size or less may also provide equivalent or better image quality to a liquid crystal display (LCD) compared to other displays, and its manufacturing process is very simple. Therefore, it is predicted to be advantageous in terms of cost in the future.

An organic photoelectric device may include an organic light emitting material between a rear plate including ITO transparent electrode patterns as an anode on a transparent glass substrate and an upper plate including a metal electrode as a cathode on a substrate. When a predetermined voltage is applied between the transparent electrode and the metal electrode, current flows through the organic light emitting material to emit light.

In 1987, Eastman Kodak, Inc., developed an organic light emitting diode including a low molecular weight aromatic diamine and an aluminum complex as an emission-layer-forming material (Applied Physics Letters. 51, 913, 1987). C. W. Tang et al. disclosed a practicable device as an organic light emitting diode in 1987 (Applied Physics Letters, 51 12, 913-915, 1987).

The organic layer may have a structure in which a thin film (hole transport layer (HTL)) of a diamine derivative and a thin film of tris(8-hydroxy-quinolate)aluminum ($Alq_3$) are laminated. The $Alq_3$ thin film of $Alq_3$ functions an emission layer for transporting electrons.

Generally, an organic photoelectric device is composed of an anode of a transparent electrode, an organic thin layer of a light emitting region, and a metal electrode (cathode) formed on a glass substrate, in that order. The organic thin layer may include an emission layer, a hole injection layer (HIL), a hole transport layer (HTL), an electron transport layer (ETL), or an electron injection layer (EIL). It may further include an electron inhibition layer or a hole inhibition layer due to the emission characteristics of the emission layer.

When an electric field is applied to the organic light emitting diode, the holes and electrons are injected from the anode and the cathode, respectively. The injected holes and electrons are recombined on the emission layer though the hole transport layer (HTL) and the electron transport layer (ETL) to provide light emitting excitons. The provided light emitting excitons emit light by transiting to the ground state.

The light emission may be classified as a fluorescent material including singlet excitons and a phosphorescent material including triplet excitons according to the light emitting mechanism.

The phosphorescent light emitting material may be useful as a light emitting material (D. F. O'Brien et al., Applied Physics Letters, 74 3, 442-444, 1999; M. A. Baldo et al., Applied Physics letters, 75 1, 4-6, 1999). Such phosphorescent emission occurs by transition of electrons from the ground state to the exited state, non-radiative transition of a singlet exciton to a triplet exciton through intersystem crossing, and transition of the triplet exciton to the ground state to emit light.

When the triplet exciton transitions, it cannot directly transition to the ground state. Therefore, the electron spin is flipped, and then it transitions to the ground state. Thus, it provides a characteristic of extended lifetime (emission duration) relative to that of fluorescent emission.

In other words, the duration of fluorescent emission is extremely short (at several nanoseconds), but the duration of phosphorescent emission is relatively long (such as at several microseconds), so that phosphorescent emission provides a characteristic of extending the lifetime (emission duration) to more than that of the fluorescent emission.

Quantum mechanically, when holes injected from the anode are recombined with electrons injected from the cathode to provide light emitting excitons, the singlet and the triplet are produced in a ratio of 1:3, in which the triplet light emitting excitons are produced at three times the amount of the singlet light emitting excitons in the organic light emitting diode.

Accordingly, the percentage of the singlet exited state is 25% (the triplet is 75%) in the case of a fluorescent material, so it has limits in luminous efficiency. On the other hand, in the case of a phosphorescent material, it can utilize 75% of the triplet exited state and 25% of the singlet exited state, so theoretically the internal quantum efficiency can reach up to 100%. When a phosphorescent light emitting material is used, it has advantages in an increase in luminous efficiency of around four times that of the fluorescent light emitting material.

In the above-mentioned organic photoelectric device, a light emitting colorant (dopant) may be added in an emission layer (host) in order to increase the efficiency and stability in the emission state.

In the above-mentioned organic light emitting diode, a light emitting colorant (dopant) may be added in an emission layer (host) in order to increase the efficiency and stability in the emission state. In this structure, the efficiency and properties of the light emission diodes are dependent on the host material in the emission layer.

SUMMARY

Embodiments are therefore directed to a polymer and an organic photoelectric device including the same, which substantially overcome one or more of the problems due to the limitations and disadvantages of the related art.

It is therefore a feature of an embodiment to provide a polymer that easily dissolves in an organic solvent, and is suitable for an emission layer of an organic photoelectric device.

It is therefore another feature of an embodiment to provide an organic photoelectric device including the polymer.

At least one of the above and other features and advantages may be realized by providing a polymer represented by the following Chemical Formula 1:

[Chemical Formula 1]

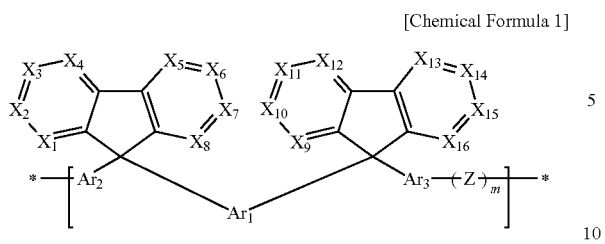

[Chemical Formula 2]

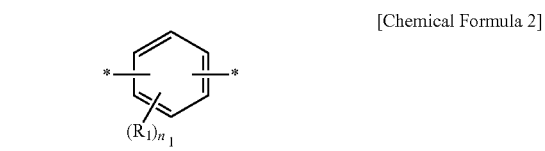

[Chemical Formula 3]

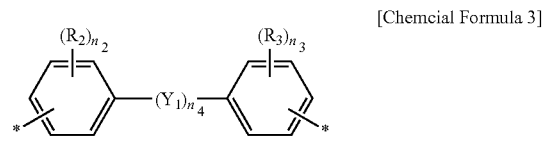

[Chemical Formula 4]

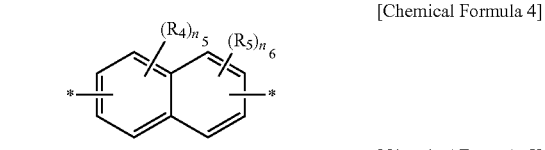

[Chemical Formula 5]

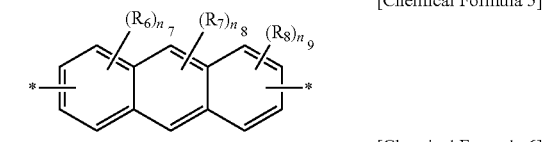

[Chemical Formula 6]

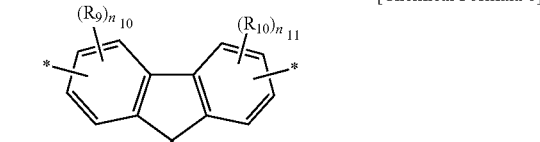

[Chemical Formula 7]

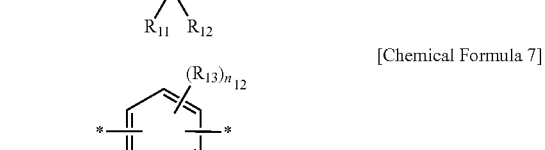

[Chemical Formula 8]

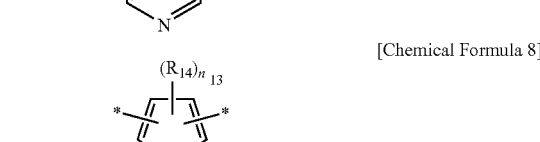

[Chemical Formula 9]

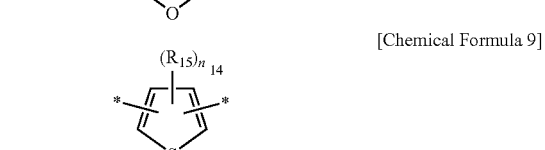

[Chemical Formula 10]

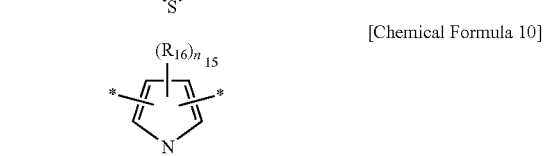

[Chemical Formula 11]

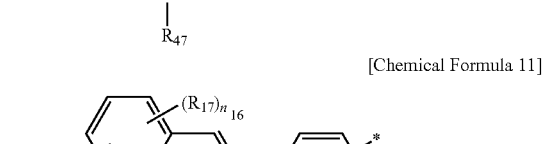

[Chemical Formula 12]

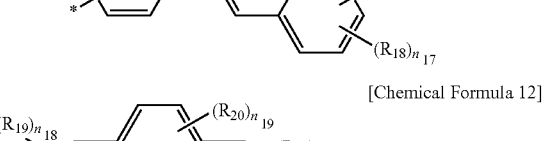

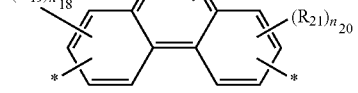

wherein, in Chemical Formula 1, $X_1$ to $X_{16}$ are independently CR' or N, where R' is hydrogen, a halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a substituted or unsubstituted C6 to C20 aryloxy, a substituted or unsubstituted C2 to C20 heterooxy, a substituted or unsubstituted C3 to C40 silyloxy, a substituted or unsubstituted C1 to C20 acyl, a substituted or unsubstituted C2 to C20 alkoxy carbonyl, a substituted or unsubstituted C2 to C20 acyloxy, a substituted or unsubstituted C2 to C20 acylamino, a substituted or unsubstituted C2 to C20 alkoxy carbonyl amino, a substituted or unsubstituted C7 to C20 aryloxy carbonyl amino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 arylthiol, a substituted or unsubstituted C1 to C20 hetero cycloalkyl thiol, a substituted or unsubstituted C1 to C20 ureide, a substituted or unsubstituted C1 to C20 phosphoric acid amide, or a substituted or unsubstituted C3 to C40 silyl, $Ar_1$ to $Ar_3$, and Z are independently a substituted or unsubstituted C6 to C30 arylene, or a substituted or unsubstituted C2 to C30 heteroarylene, and m is an integer ranging from 0 to 4.

$Ar_1$ to $Ar_3$ may be independently a substituted or unsubstituted carbazolene, a substituted or unsubstituted aryleneamine, a substituted or unsubstituted phenylene, a substituted or unsubstituted tolylene, a substituted or unsubstituted naphthylene, a substituted or unsubstituted stilbenzylene, a substituted or unsubstituted fluorenylene, a substituted or unsubstituted anthracenylene, a substituted or unsubstituted terphenylene, a substituted or unsubstituted pyrenylene, a substituted or unsubstituted diphenylanthracenylene, a substituted or unsubstituted dinaphthylanthracenylene, a substituted or unsubstituted pentacenylene, a substituted or unsubstituted bromophenylene, a substituted or unsubstituted hydroxyphenylene, a substituted or unsubstituted thienylene, a substituted or unsubstituted pyridylene, a substituted or unsubstituted azobenzenylene, or a substituted or unsubstituted ferrocenylene.

Z may be a substituted or unsubstituted phenylene, a substituted or unsubstituted naphthylene, a substituted or unsubstituted anthracenylene, a substituted or unsubstituted fluorenylene, a substituted or unsubstituted thiophenylene, a substituted or unsubstituted pyrrolene, a substituted or unsubstituted pyridinylene, a substituted or unsubstituted aryloxadiazolene, a substituted or unsubstituted triazolene, a substituted or unsubstituted carbazolene, a substituted or unsubstituted aryleneamine, or a substituted or unsubstituted arylenesilane.

Z may be selected from compounds represented by the following Chemical Formulae 2 to 22:

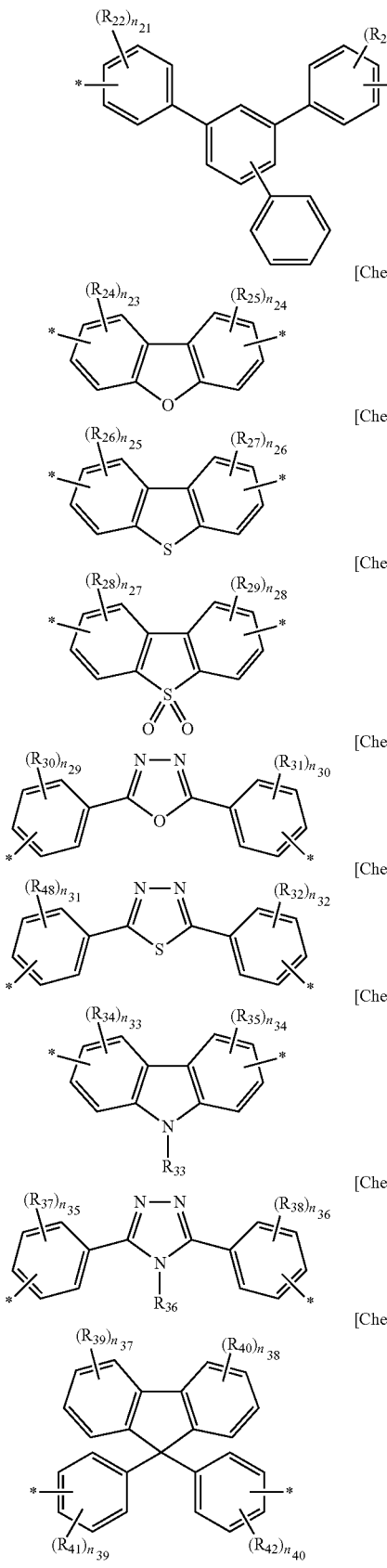

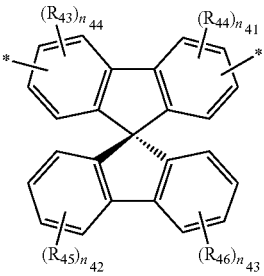

wherein, in Chemical Formulae 2 to 22, $R_1$ to $R_{48}$ are independently a halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a substituted or unsubstituted C6 to C20 aryloxy, a substituted or unsubstituted C2 to C20 heterooxy, a substituted or unsubstituted C3 to C40 silyl oxy, a substituted or unsubstituted C1 to C20 acyl, a substituted or unsubstituted C2 to C20 alkoxy carbonyl, a substituted or unsubstituted C2 to C20 acyl oxy, a substituted or unsubstituted C2 to C20 acyl amino, a substituted or unsubstituted C2 to C20 alkoxy carbonyl amino, a substituted or unsubstituted C7 to C20 aryl oxycarbonylamino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 aryl thiol, a substituted or unsubstituted C1 to C20 hetero cyclo alkyl thiol, a substituted or unsubstituted C1 to C20 ureide, a substituted or unsubstituted C1 to C20 phosphoric acid amide, or a substituted or unsubstituted C3 to C40 silyl, $Y_1$ is a single bond, O, S, NR", SiR"R'", or CR"R'", where R" and R'" are independently hydrogen, a halogen, a cyano, a hydroxyl, an amino, a nitro, a carboxyl, a substituted or unsubstituted C1 to C20 alkyl, a substituted or unsubstituted C6 to C30 aryl, or a substituted or unsubstituted C2 to C30 heteroaryl, $n_{42}$ and $n_{43}$ are independently integers ranging from 0 to 5, $n_1$ to $n_3$, $n_{16}$, $n_{17}$, $n_{21}$, $n_{22}$, $n_{29}$, $n_{30}$ to $n_{32}$, $n_{35}$ to $n_{38}$, $n_{39}$, and $n_{40}$ are independently integers ranging from 0 to 4, $n_5$, $n_6$, $n_7$, $n_9$, $n_{10}$ to $n_{12}$, $n_{18}$, $n_{20}$, $n_{23}$ to $n_{28}$, $n_{33}$, $n_{34}$, $n_{41}$, and $n_{44}$ are independently integers ranging from 0 to 3, $n_8$, $n_{13}$ to $n_{15}$, and $n_{19}$ are independently integers ranging from 0 to 2, and $n_4$ is 0 or 1.

The polymer may have weight average molecular weight of about 1000 to about 5,000,000.

The polymer may have number average molecular weight of about 500 to about 2,000,000.

At least one of the above and other features and advantages may also be realized by providing an organic photoelectric device, including an organic layer between a pair of electrodes, wherein the organic layer includes the polymer according to an embodiment.

The organic layer may be an emission layer.

The polymer may be a host in the emission layer.

The organic layer may be a hole injection layer (HIL), a hole transport layer (HTL), a hole blocking layer, or a combination thereof.

The organic layer may be an electron injection layer (EIL), an electron transport layer (ETL), an electron blocking layer, or a combination thereof.

At least one of the above and other features and advantages may also be realized by providing a polymer represented by one of the following Chemical Formulae 23 to 28:

[Chemical Formula 23]

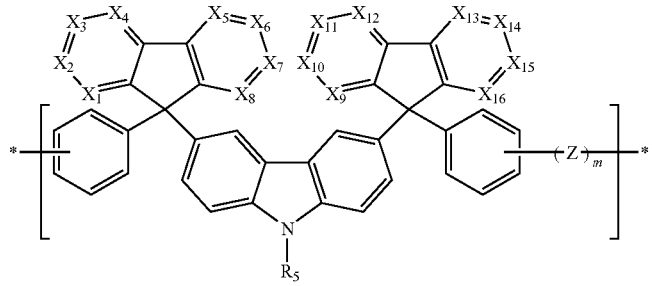

[Chemical Formula 24]

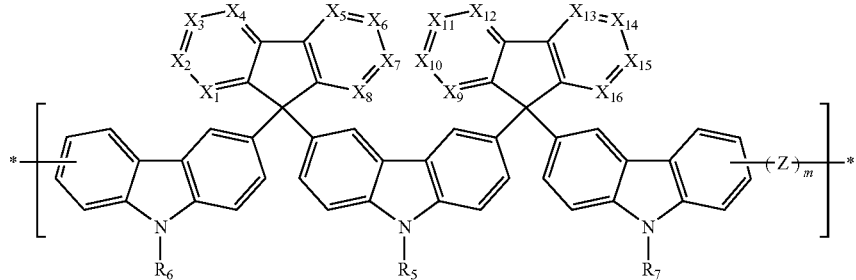

[Chemical Formula 25]

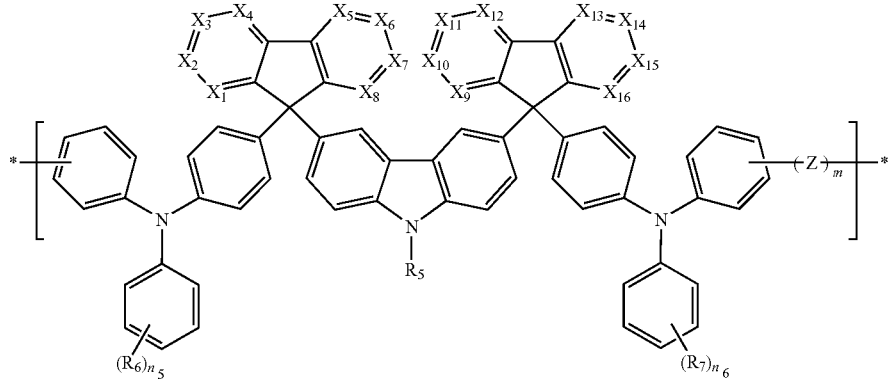

[Chemical Formula 26]

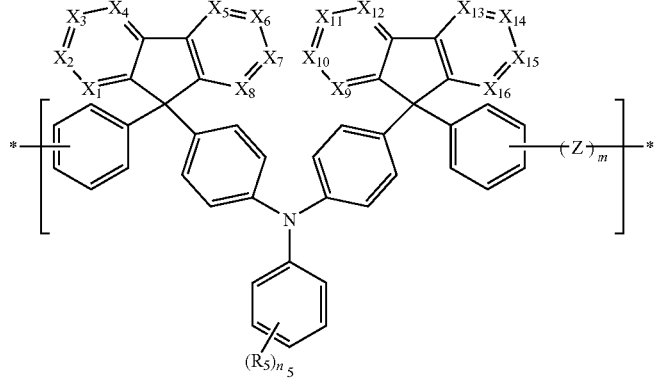

-continued

[Chemical Formula 27]

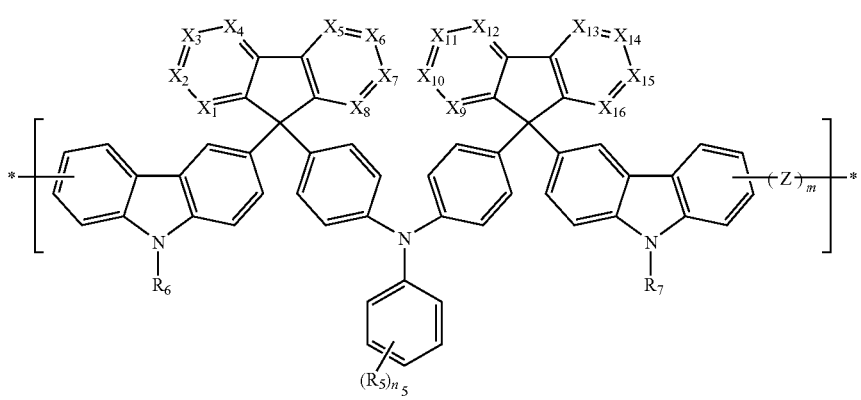

[Chemical Formula 28]

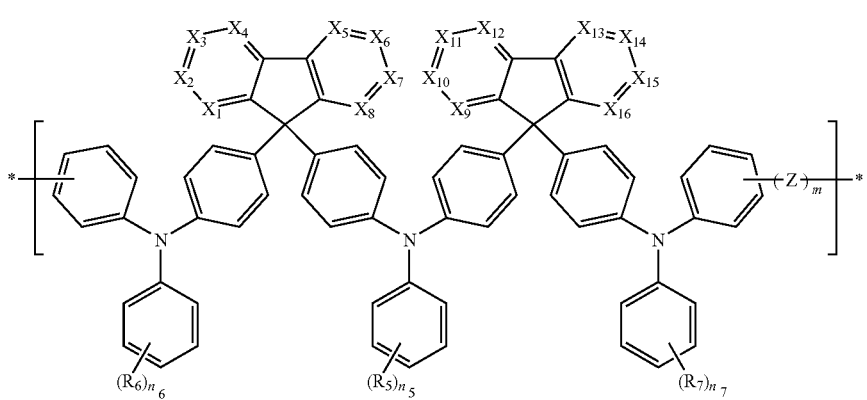

wherein, in Chemical Formulae 23 to 28, $X_1$ to $X_{16}$ are independently CR' or N, Z is a substituted or unsubstituted C6 to C30 arylene, or a substituted or unsubstituted C2 to C30 heteroarylene, $R_5$ to $R_7$ and R' are independently hydrogen, a halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a substituted or unsubstituted C6 to C20 aryloxy, a substituted or unsubstituted C2 to C20 heterooxy, a substituted or unsubstituted C3 to C40 silyloxy, a substituted or unsubstituted C1 to C20 acyl, a substituted or unsubstituted C2 to C20 alkoxy carbonyl, a substituted or unsubstituted C2 to C20 acyloxy, a substituted or unsubstituted C2 to C20 acylamino, a substituted or unsubstituted C2 to C20 alkoxy carbonyl amino, a substituted or unsubstituted C7 to C20 aryloxy carbonyl amino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 arylthiol, a substituted or unsubstituted C1 to C20 hetero cycloalkyl thiol, a substituted or unsubstituted C1 to C20 ureide, a substituted or unsubstituted C1 to C20 phosphoric acid amide, or a substituted or unsubstituted C3 to C40 silyl, $n_5$ to $n_7$ are integers ranging from 0 to 5, and m is an integer ranging from 0 to 4.

Z may be a substituted or unsubstituted phenylene, a substituted or unsubstituted naphthylene, a substituted or unsubstituted anthracenylene, a substituted or unsubstituted fluorenylene, a substituted or unsubstituted thiophenylene, a substituted or unsubstituted pyrrolene, a substituted or unsubstituted pyridinylene, a substituted or unsubstituted aryloxadiazolene, a substituted or unsubstituted triazolene, a substituted or unsubstituted carbazolene, a substituted or unsubstituted aryleneamine, or a substituted or unsubstituted arylenesilane.

Z may be selected from compounds represented by the following Chemical Formulae 2 to 22:

[Chemical Formula 2]

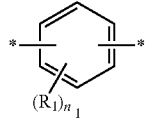

[Chemcial Formula 3]

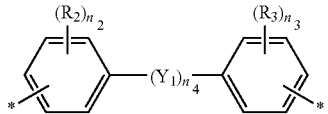

[Chemical Formula 4]

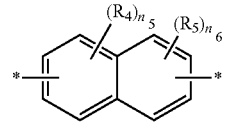

[Chemical Formula 5]

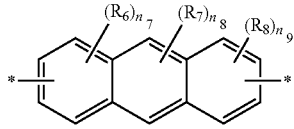

-continued

[Chemical Formula 6]
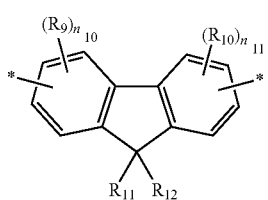

[Chemical Formula 7]
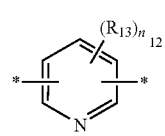

[Chemical Formula 8]
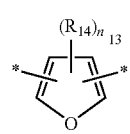

[Chemical Formula 9]
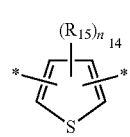

[Chemical Formula 10]
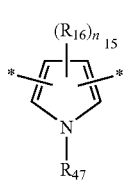

[Chemical Formula 11]
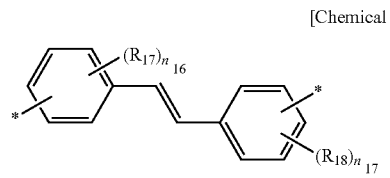

[Chemical Formula 12]
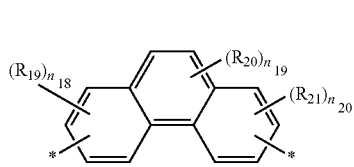

[Chemical Formula 13]
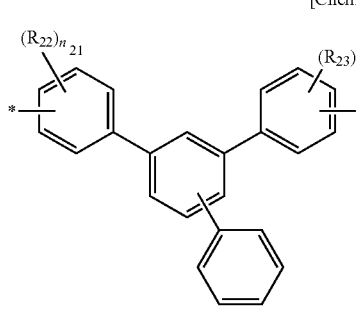

[Chemical Formula 14]
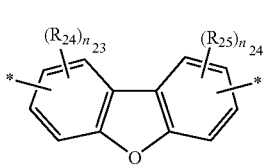

[Chemical Formula 15]
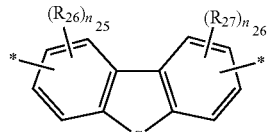

[Chemical Formula 16]
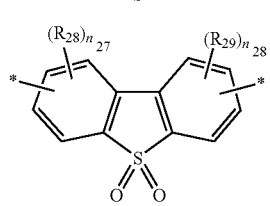

[Chemical Formula 17]
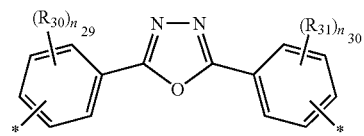

[Chemical Formula 18]
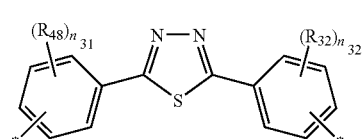

[Chemical Formula 19]
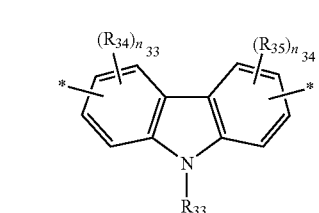

[Chemical Formula 20]
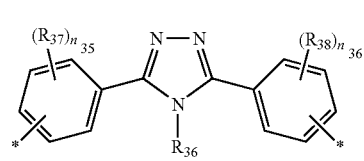

[Chemical Formula 21]
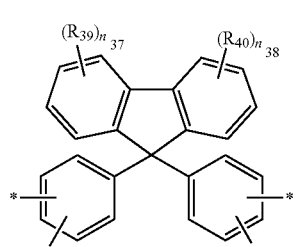

[Chemical Formula 22]
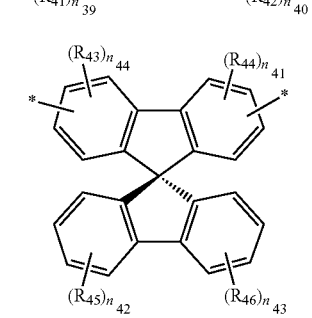

wherein, in Chemical Formulae 2 to 22, $R_1$ to $R_{48}$ are independently a halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a substituted or unsubstituted C6 to C20 aryloxy, a substituted or unsubstituted C2 to C20 heterooxy, a substituted or unsubstituted C3 to C40 silyl oxy, a substituted or unsubstituted C1 to C20 acyl, a substituted or unsubstituted C2 to C20 alkoxy carbonyl, a substituted or unsubstituted C2 to C20 acyl oxy, a substituted or unsubstituted C2 to C20 acyl amino, a substituted or unsubstituted C2 to C20 alkoxy carbonyl amino, a substituted or unsubstituted C7 to C20 aryl oxycarbonylamino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 aryl thiol, a substituted or unsubstituted C1 to C20 hetero cyclo alkyl thiol, a substituted or unsubstituted C1 to C20 ureide, a substituted or unsubstituted C1 to C20 phosphoric acid amide, or a substituted or unsubstituted C3 to C40 silyl, $Y_1$ is a single bond, O, S, NR'', SiR''R''', or CR''R''', where R'' and R''' are independently selected from the group consisting of hydrogen, a halogen, a cyano, a hydroxyl, an amino, a nitro, a carboxyl, a substituted or unsubstituted C1 to C20 alkyl, a substituted or unsubstituted C6 to C30 aryl, and a substituted or unsubstituted C2 to C30 heteroaryl, $n_{42}$ and $n_{43}$ are independently integers ranging from 0 to 5, $n_1$ to $n_3$, $n_{16}$, $n_{17}$, $n_{21}$, $n_{22}$, $n_{29}$, $n_{30}$ to $n_{32}$, $n_{35}$ to $n_{38}$, $n_{39}$, and $n_{40}$ are independently integers ranging from 0 to 4, $n_5$, $n_6$, $n_7$, $n_9$, $n_{10}$ to $n_{12}$, $n_{18}$, $n_{20}$, $n_{23}$ to $n_{28}$, $n_{33}$, $n_{34}$, $n_{41}$, and $n_{44}$ are independently integers ranging from 0 to 3, $n_8$, $n_{13}$ to $n_{15}$, and $n_{19}$ are independently integers ranging from 0 to 2, and $n_4$ is 0 or 1.

BRIEF DESCRIPTION OF THE DRAWINGS

The above and other features and advantages will become more apparent to those of skill in the art by describing in detail example embodiments with reference to the attached drawings, in which.

Figure 1:
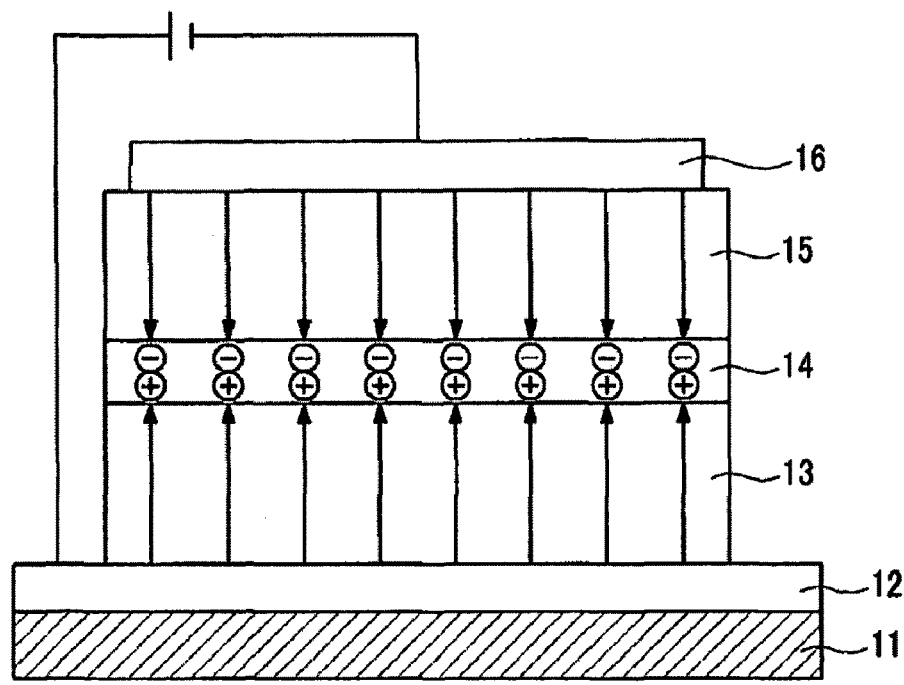
FIG. 1 illustrates a cross-sectional view of an organic photoelectric device according to a first embodiment.

<Description of Reference Numerals Indicating Elements in the Drawings>

| | |
|---|---|
| 11: substrate | 12: anode |
| 13: hole transport layer (HTL) | 14: organic emission layer |
| 15: electron transport layer (ETL) | 16: cathode |

DETAILED DESCRIPTION

Korean Patent Application No. 10-2007-0096669, filed on Sep. 21, 2007, in the Korean Intellectual Property Office, and entitled: "Polymer, and Organic Photoelectric Device Comprising the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items.

As described herein, a polymer according to embodiments may be easily dissolved in an organic solvent, and may be used to fabricate an emission layer of an organic photoelectric device, e.g., as a host material, since it emits fluorescence and phosphorescence at a red wavelength through a blue wavelength.

A polymer according to an embodiment is represented by the following Chemical Formula 1:

[Chemical Formula 1]

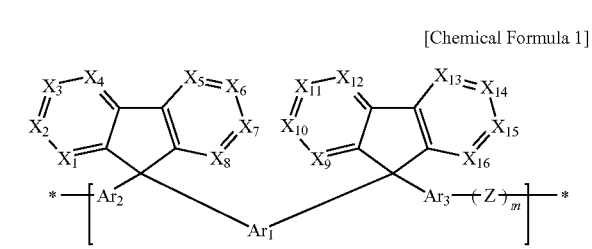

In Chemical Formula 1, $X_1$ to $X_{16}$ may be independently CR' or N,

In Chemical Formula 1, $Ar_1$ to $Ar_3$ (i.e., $Ar_1$, $Ar_2$, and $Ar_3$) and Z may be independently a substituted or unsubstituted C6 to C30 arylene, or a substituted or unsubstituted C2 to C30 heteroarylene.

In Chemical Formula 1, R' may be independently hydrogen, a halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a substituted or unsubstituted C6 to C20 aryloxy, a substituted or unsubstituted C2 to C20 heterooxy, a substituted or unsubstituted C3 to C40 silyloxy, a substituted or unsubstituted C1 to C20 acyl, a substituted or unsubstituted C2 to C20 alkoxy carbonyl, a substituted or unsubstituted C2 to C20 acyloxy, a substituted or unsubstituted C2 to C20 acylamino, a substituted or unsubstituted C2 to C20 alkoxy carbonyl amino, a substituted or unsubstituted C7 to C20 aryloxy carbonyl amino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 arylthiol, a substituted or unsubstituted C1 to C20 hetero cycloalkyl thiol, a substituted or unsubstituted C1 to C20 ureide, a substituted or unsubstituted C1 to C20 phosphoric acid amide, or a substituted or unsubstituted C3 to C40 silyl.

In Chemical Formula 1, m may be an integer ranging from 0 to 4.

In an implementation, $Ar_1$ to $Ar_3$ may be independently divalent moieties derived from a substituted or unsubstituted carbazole, a substituted or unsubstituted arylamine, a substituted or unsubstituted phenyl, a substituted or unsubstituted tolyl, a substituted or unsubstituted naphthyl, a substituted or unsubstituted stilbene, a substituted or unsubstituted fluorenyl, a substituted or unsubstituted anthracenyl, a substituted or unsubstituted terphenyl, a substituted or unsubstituted pyrenyl, a substituted or unsubstituted diphenyl anthracenyl, a substituted or unsubstituted dinaphthylanthracenyl, a substituted or unsubstituted pentacenyl, a substituted or unsubstituted bromophenyl, a substituted or unsubstituted hydroxyphenyl, a substituted or unsubstituted thienyl, a substituted or unsubstituted pyridyl, a substituted or unsubstituted azobenzenyl, or a substituted or unsubstituted ferrocenyl.

In an implementation, Z may be a divalent moiety derived from a substituted or unsubstituted phenyl, a substituted or unsubstituted naphthyl, a substituted or unsubstituted anthracenyl, a substituted or unsubstituted fluorenyl, a substituted or unsubstituted thiophene, a substituted or unsubstituted pyrrol, a substituted or unsubstituted pyridine, a substituted or unsubstituted aryloxadiazole, a substituted or unsubstituted triazole, a substituted or unsubstituted carbazole, a substituted or unsubstituted arylamine, or a substituted or unsubstituted arylsilane.

As used herein, the substituted arylene and substituted heteroarylene respectively refer to an arylene and a heteroarylene substituted with a C1 to C30 alkyl, a halogen, a C1 to C30 haloalkyl, a C6 to C30 aryl, or a C2 to C30 heteroaryl.

As used herein, the substituted alkyl, substituted alkenyl, substituted aryl, substituted heteroaryl, substituted alkoxy, substituted aryl oxy, substituted hetero oxy, substituted silyl oxy, substituted acyl, substituted alkoxy carbonyl, substituted acyl oxy, substituted acyl amino, substituted alkoxy carbonyl amino, substituted aryl oxycarbonylamino, substituted sulfamoyl amino, substituted sulfonyl, substituted alkylthiol, substituted aryl thiol, substituted hetero cycloalkyl thiol, substituted ureide, substituted phosphoric acid amide, and substituted silyl respectively refer to an alkyl, alkenyl, an aryl, a heteroaryl, an alkoxy, an aryl oxy, a heterooxy, a silyl oxy, an acyl, an alkoxy carbonyl, an acyl oxy, an acyl amino, an alkoxy carbonyl amino, an aryl oxycarbonylamino, a sulfamoyl amino, a sulfonyl, an alkylthiol, an aryl thiol, a hetero cycloalkyl thiol, a ureide, a phosphoric acid amide, and silyl substituted with a C1 to C30 alkyl, a halogen, a C1 to C30 haloalkyl, a C6 to C30 aryl, or a C2 to C30 heteroaryl.

As used herein, the substituted carbazole, substituted arylamine, substituted phenyl, substituted tolyl, substituted naphthyl, substituted stilbene, substituted fluorenyl, substituted anthracenyl, substituted terphenyl, substituted pyrenyl, substituted diphenylanthracenyl, substituted dinaphthylanthracenyl, substituted pentacenyl, substituted bromophenyl, substituted hydroxyphenyl, substituted thienyl, substituted pyridyl, substituted azobenzenyl, and substituted ferrocenyl refers to a carbazole, an arylamine, a phenyl, a tolyl, a naphthyl, a stilbene, a fluorenyl, an anthracenyl, a terphenyl, a pyrenyl, a diphenylanthracenyl, a dinaphthylanthracenyl, a pentacenyl, a bromophenyl, a hydroxyphenyl, a thienyl, a pyridyl, azobenzenyl, and ferrocenyl substituted with a C1 to C30 alkyl, a halogen, a C1 to C30 haloalkyl, a C6 to C30 aryl, or a C2 to C30 heteroaryl.

As used herein, the substituted thiophene, substituted pyrrol, substituted pyridine, substituted aryloxadiazole, substituted triazole, and substituted arylsilane refer to a thiophene, a pyrrol, a pyridine, an aryloxadiazole, a triazole and an arylsilane substituted with a C1 to C30 alkyl, a halogen, a C1 to C30 haloalkyl, a C6 to C30 aryl, or a C2 to C30 heteroaryl.

In the present specification, the term "hetero" refers to one including 1 to 3 heteroatoms selected from the group consisting of nitrogen (N), oxygen (O), sulfur (S), and phosphorus (P), and the remainder being carbon.

In Chemical Formula 1, Z is preferably selected from compounds represented by the following Formulae 2 to 22:

[Chemical Formula 2]

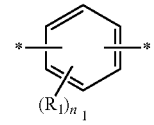

[Chemcial Formula 3]

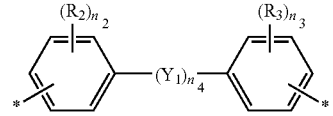

[Chemical Formula 4]

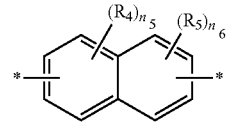

[Chemical Formula 5]

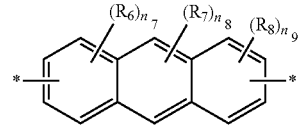

[Chemical Formula 6]

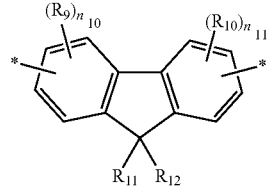

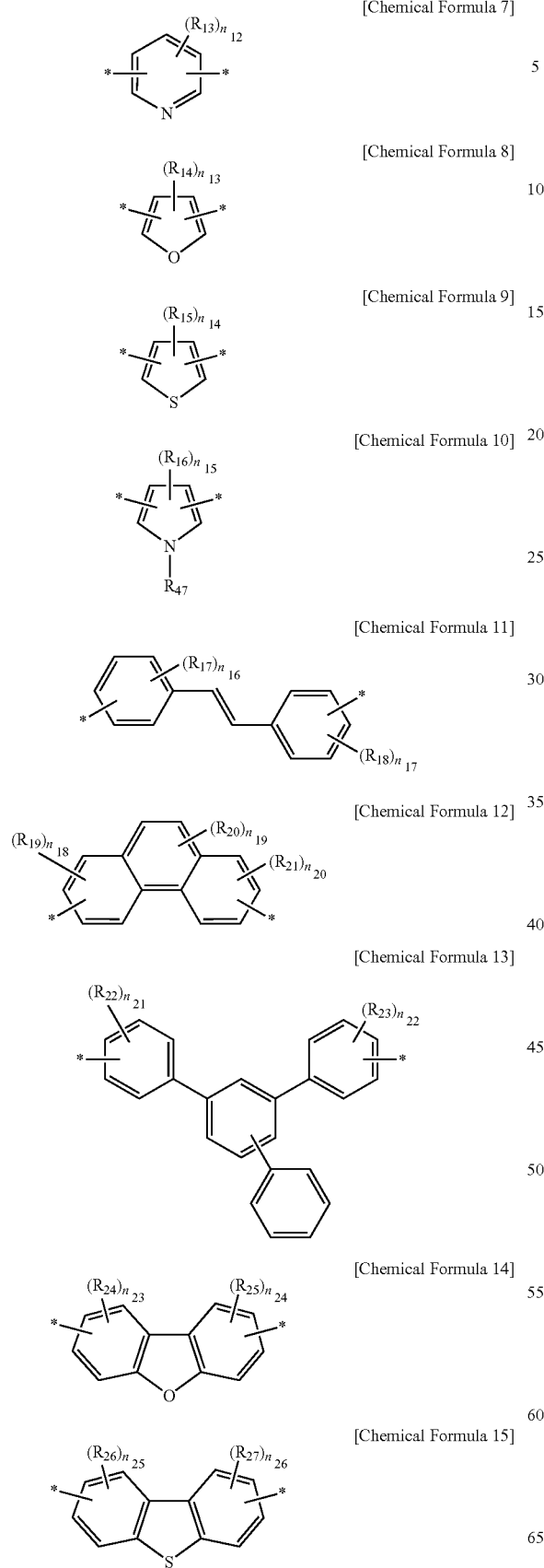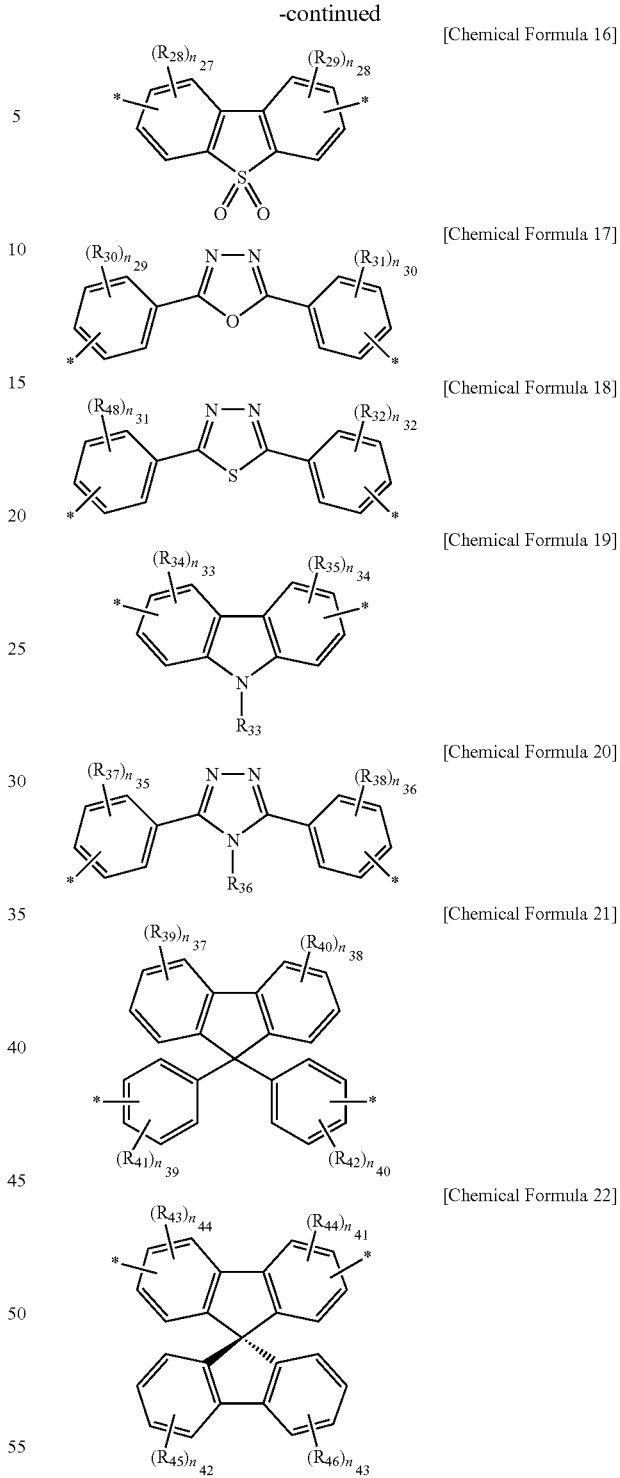

In Chemical Formulae 2 to 22, $R_1$ to $R_{48}$ may be independently halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a substituted or unsubstituted C6 to C20 aryloxy, a substituted or unsubstituted C2 to C20 heterooxy, a substituted or unsubstituted C3 to C40 silyl oxy, a substituted or unsubstituted C1 to C20 acyl, a substituted or unsubstituted C2 to C20 alkoxy carbonyl, a substituted or unsubstituted C2 to C20 acyl oxy, a substituted or unsubstituted C2 to C20 acyl amino, a substituted or unsubstituted C2 to C20 alkoxy carbonyl amino, a substituted or unsubstituted C7 to C20 aryl oxycarbonylamino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 aryl thiol, a substituted or unsubstituted C1 to C20 hetero cyclo alkyl thiol, a substituted or unsubstituted C1 to C20 ureide, a substituted or unsubstituted C1 to C20 phosphoric acid amide, and a substituted or unsubstituted C3 to C40 silyl.

In Chemical Formulae 2 to 22, $Y_1$ may be a single bond, O, S, NR", SiR"R"', and CR"R", where R" and R'" may be independently hydrogen, a halogen, a cyano, a hydroxyl, an amino, a nitro, a carboxyl, a substituted or unsubstituted C1 to C20 alkyl, a substituted or unsubstituted C6 to C30 aryl, and a substituted or unsubstituted C2 to C30 heteroaryl.

In Chemical Formulae 2 to 22, $n_{42}$ and $n_{43}$ may be independently integers ranging from 0 to 5.

In Chemical Formulae 2 to 22, $n_1$ to $n_3$, $n_{16}$, $n_{17}$, $n_{21}$, $n_{22}$, $n_{29}$, $n_{30}$ to $n_{32}$, $n_{35}$ to $n_{38}$, $n_{39}$, and $n_{40}$ may be independently integers ranging from 0 to 4.

In Chemical Formulae 2 to 22, $n_5$, $n_6$, $n_7$, $n_9$, $n_{10}$ to $n_{12}$, $n_{18}$, $n_{20}$, $n_{23}$ to $n_{28}$, $n_{33}$, $n_{34}$, $n_{41}$, and $n_{44}$ may be independently integers ranging from 0 to 3.

In Chemical Formulae 2 to 22, $n_8$, $n_{13}$ to $n_{15}$, and $n_{19}$ may be independently integers ranging from 0 to 2.

In Chemical Formulae 2 to 22, $n_4$ may be 0 or 1.

According to various embodiments, compounds represented by Formula 1 may be polymers represented by the following Chemical Formulae 23 to 28:

[Chemical Formula 23]

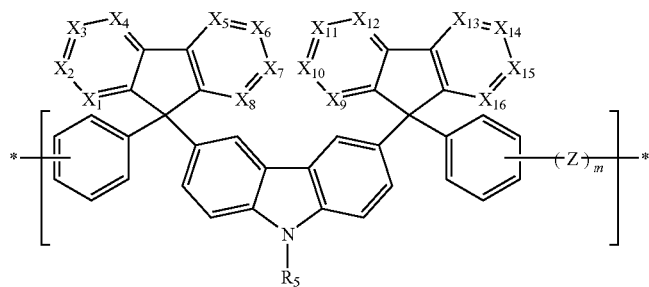

[Chemical Formula 24]

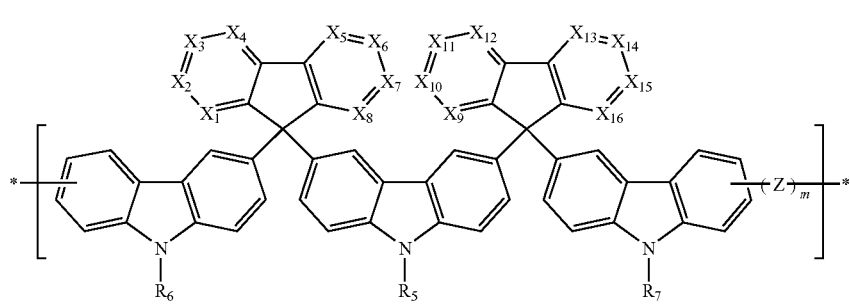

[Chemical Formula 25]

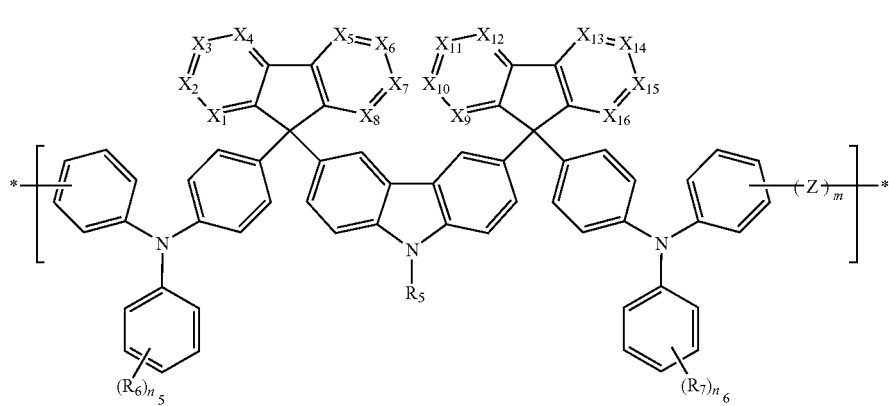

[Chemical Formula 26]

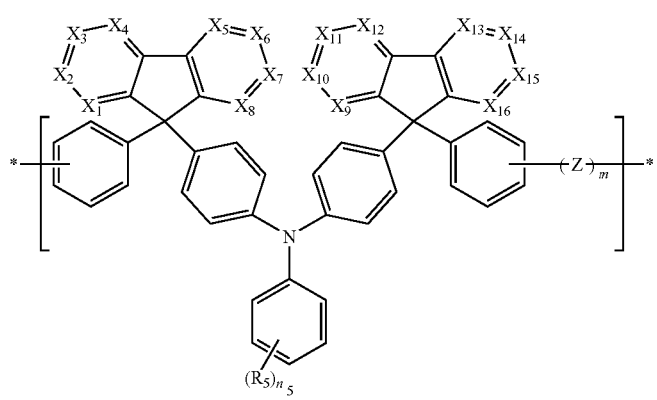

[Chemical Formula 27]

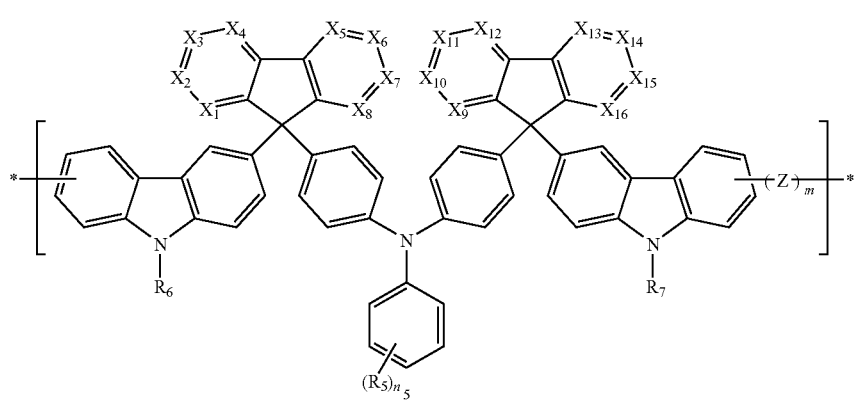

[Chemical Formula 28]

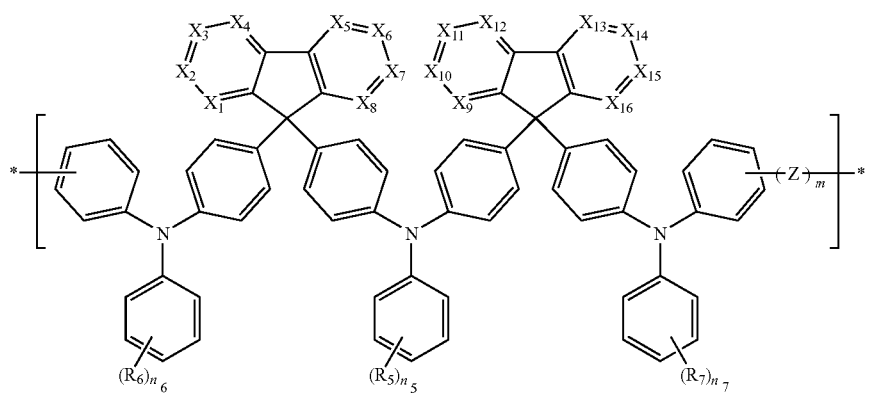

In Chemical Formulae 23 to 28, $X_1$ to $X_{16}$ may be independently CR' or N.

In Chemical Formulae 23 to 28, Z may be a substituted or unsubstituted C6 to C30 arylene, or a substituted or unsubstituted C2 to C30 heteroarylene.

In Chemical Formulae 23 to 28, $R_5$ to $R_7$ and R' may be independently hydrogen, a halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a substituted or unsubstituted C6 to C20 aryloxy, a substituted or unsubstituted C2 to C20 heterooxy, a substituted or unsubstituted C3 to C40 silyloxy, a substituted or unsubstituted C1 to C20 acyl, a substituted or unsubstituted C2 to C20 alkoxy carbonyl, a substituted or unsubstituted C2 to C20 acyloxy, a substituted or unsubstituted C2 to C20 acylamino, a substituted or unsubstituted C2 to C20 alkoxy carbonyl amino, a substituted or unsubstituted C7 to C20 aryloxy carbonyl amino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 arylthiol, a substituted or unsubstituted C1 to C20 hetero cycloalkyl thiol, a substituted or unsubstituted C1 to C20 ureide, a substituted or unsubstituted C1 to C20 phosphoric acid amide, or a substituted or unsubstituted C3 to C40 silyl.

In Chemical Formulae 23 to 28, $n_5$ to $n_7$ may independently be integers ranging from 0 to 5.

In Chemical Formulae 23 to 28, m may be an integer ranging from 0 to 4.

In Formulae 23 to 28, specific examples of Z are the same as in Chemical Formula 1.

More specific examples of Chemical Formulae 23 to 28 may include polymers represented by the following Chemical Formulae 29 to 73:

[Chemical Formula 29]
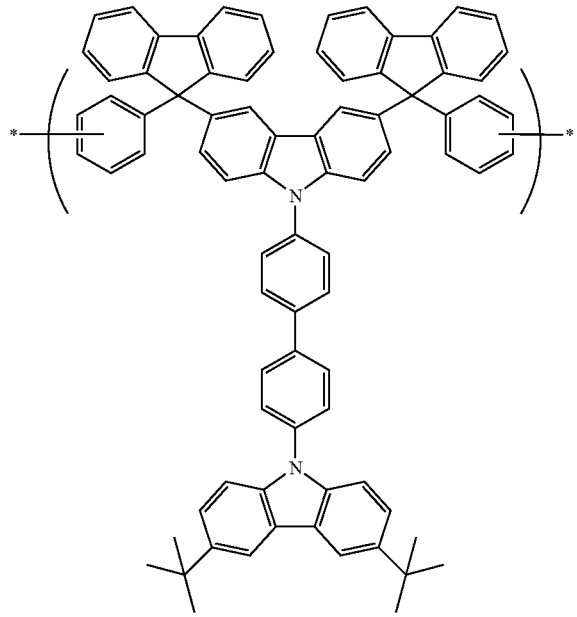
[Chemical Formula 30]
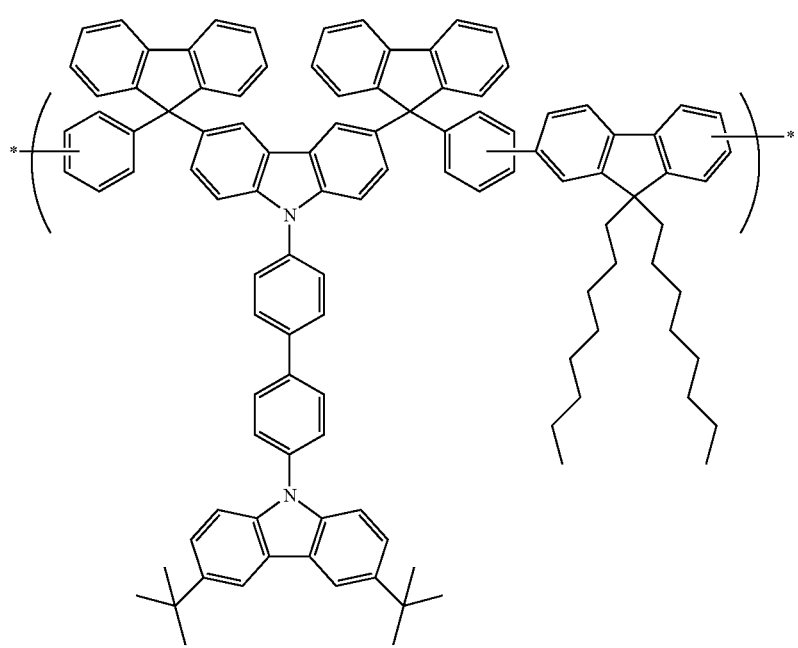

[Chemical Formula 31]
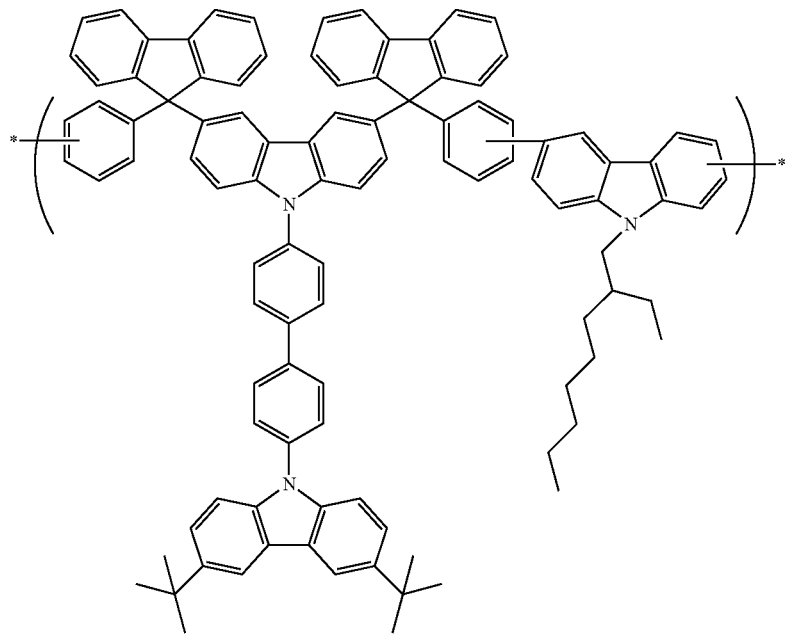
[Chemical Formula 32]
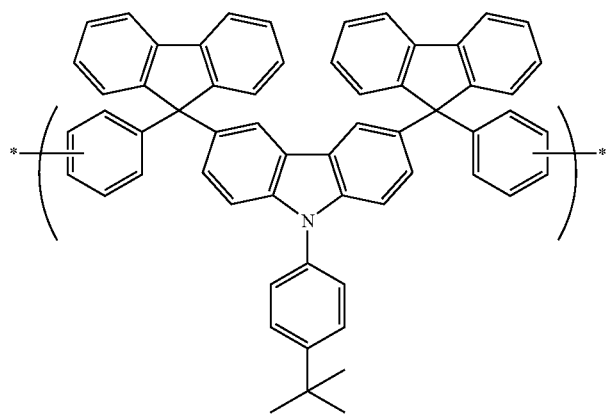
[Chemical Formula 33]
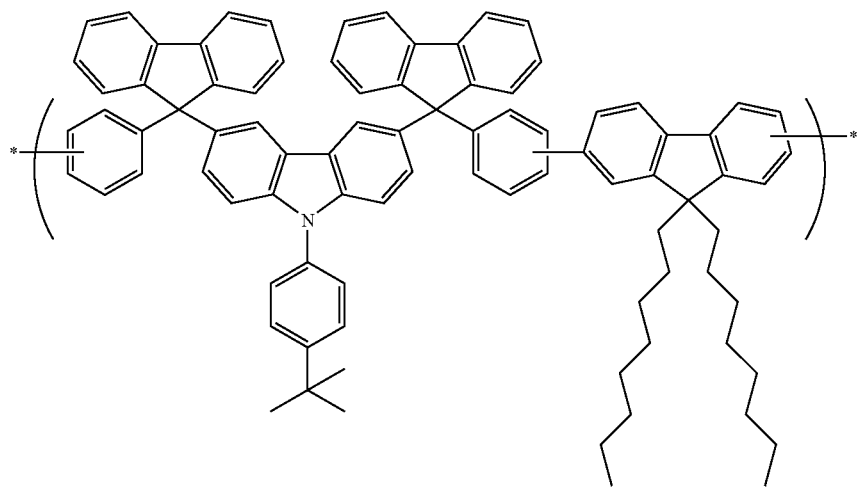

[Chemical Formula 34]
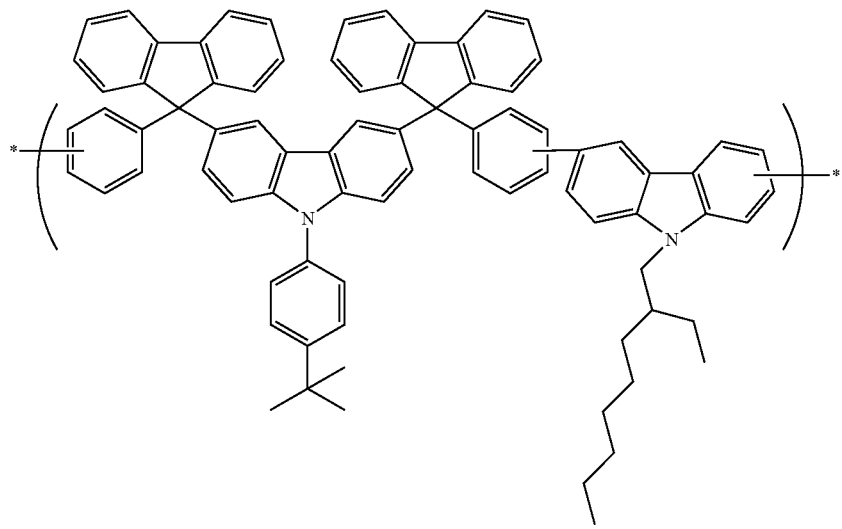
[Chemical Formula 35]
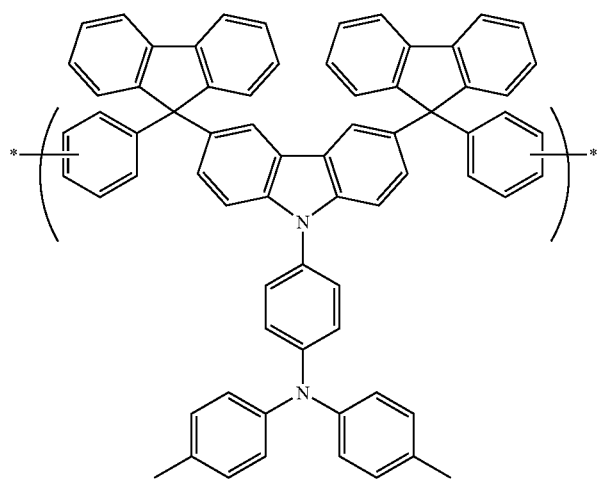
[Chemical Formula 36]
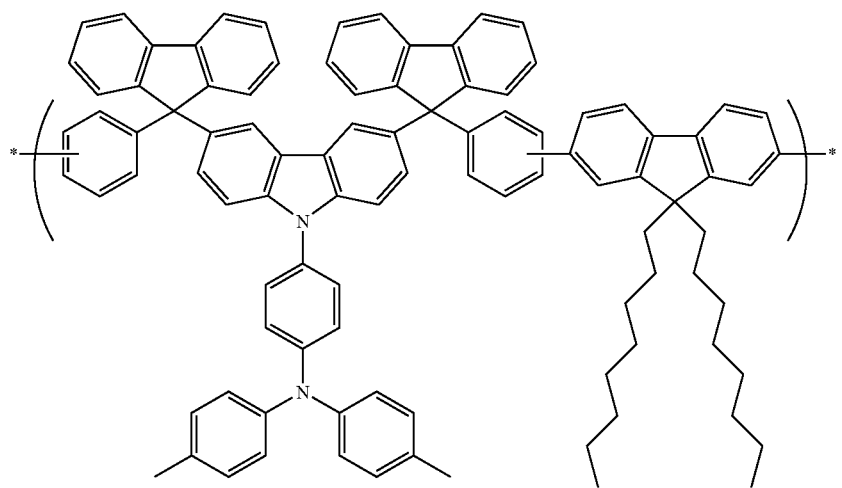

-continued
[Chemical Formula 37]
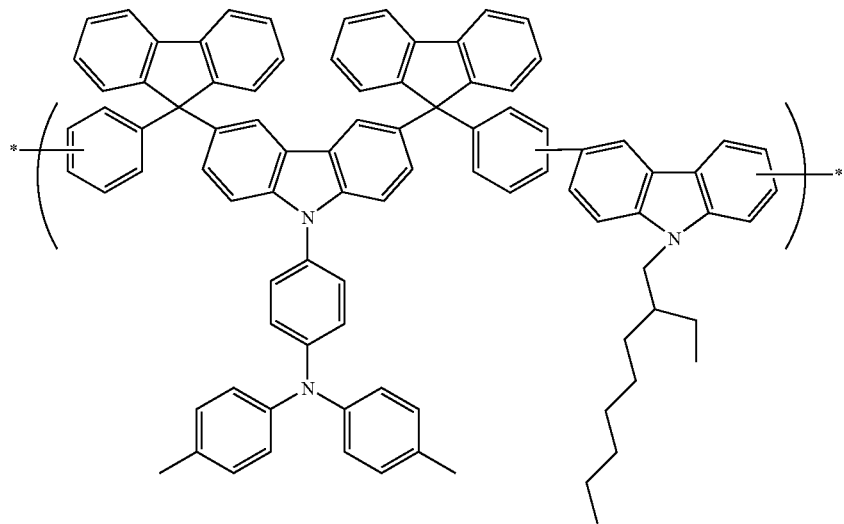
[Chemical Formula 38]
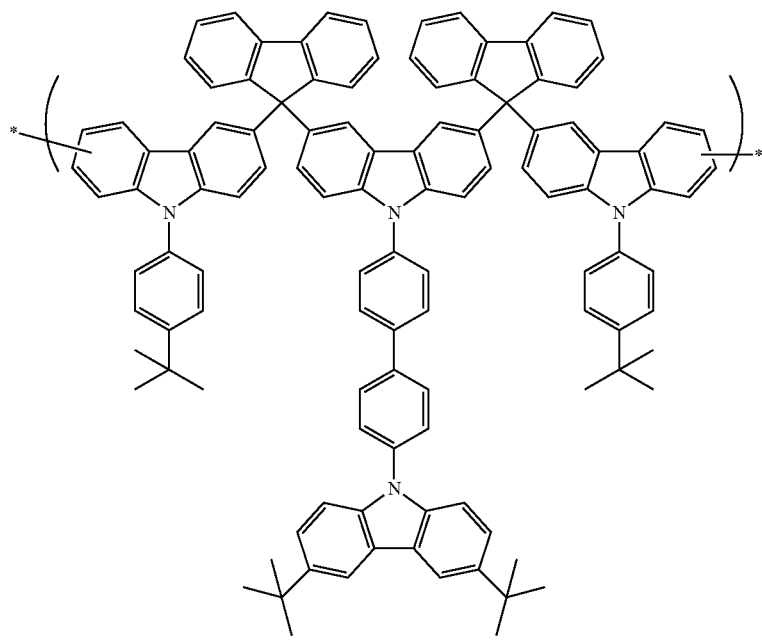

[Chemical Formula 39]
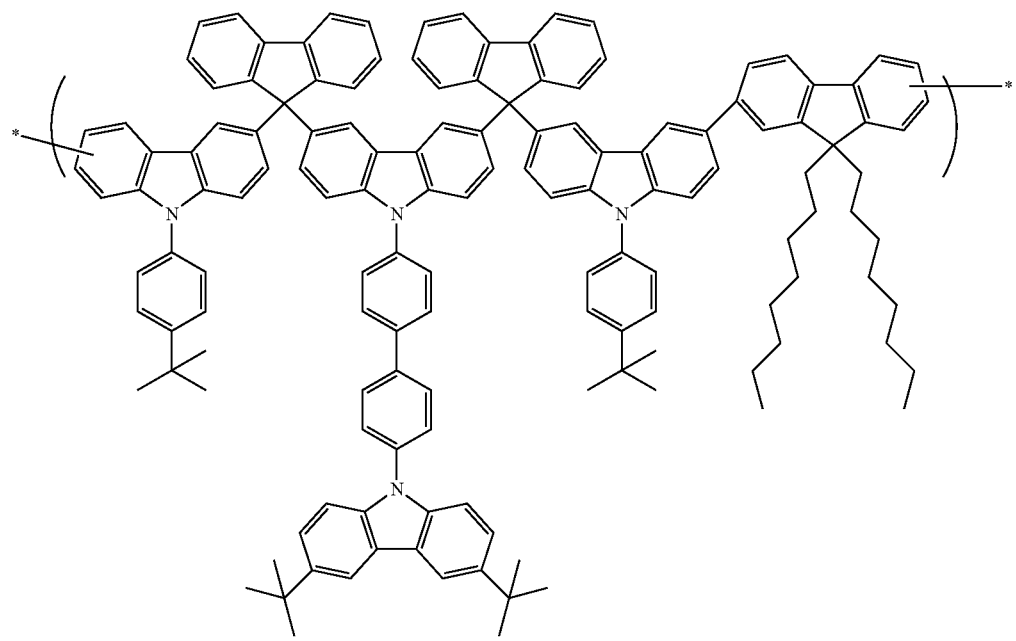
[Chemical Formula 40]
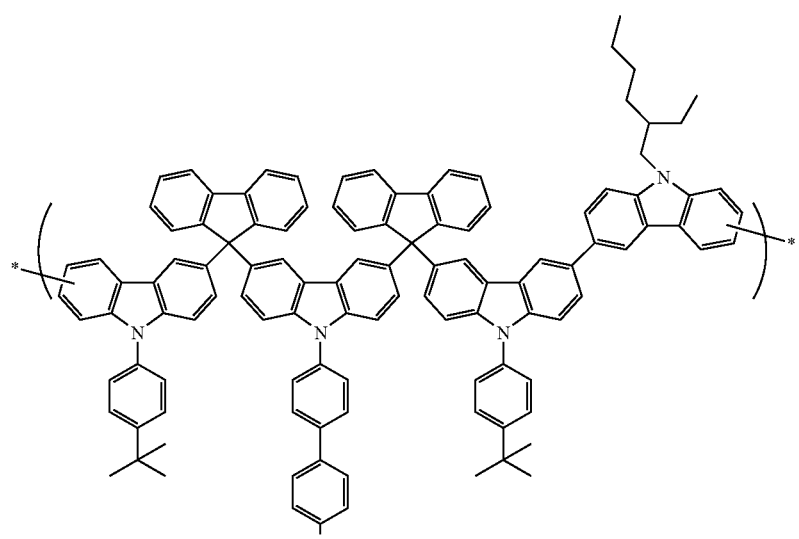
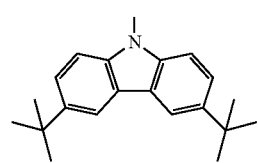

[Chemical Formula 41]
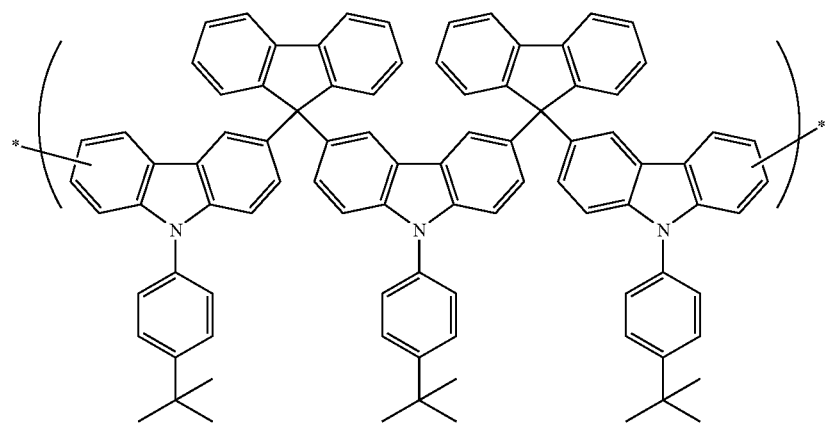
[Chemical Formula 42]
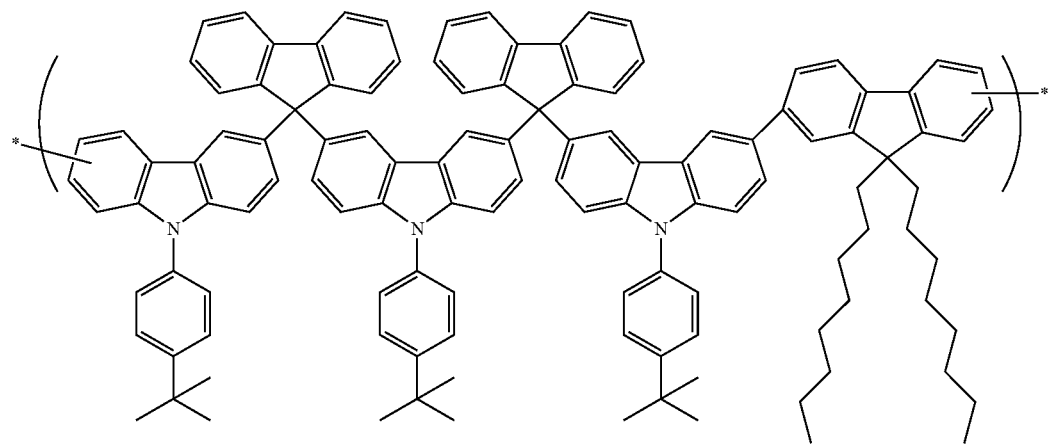
[Chemical Formula 43]
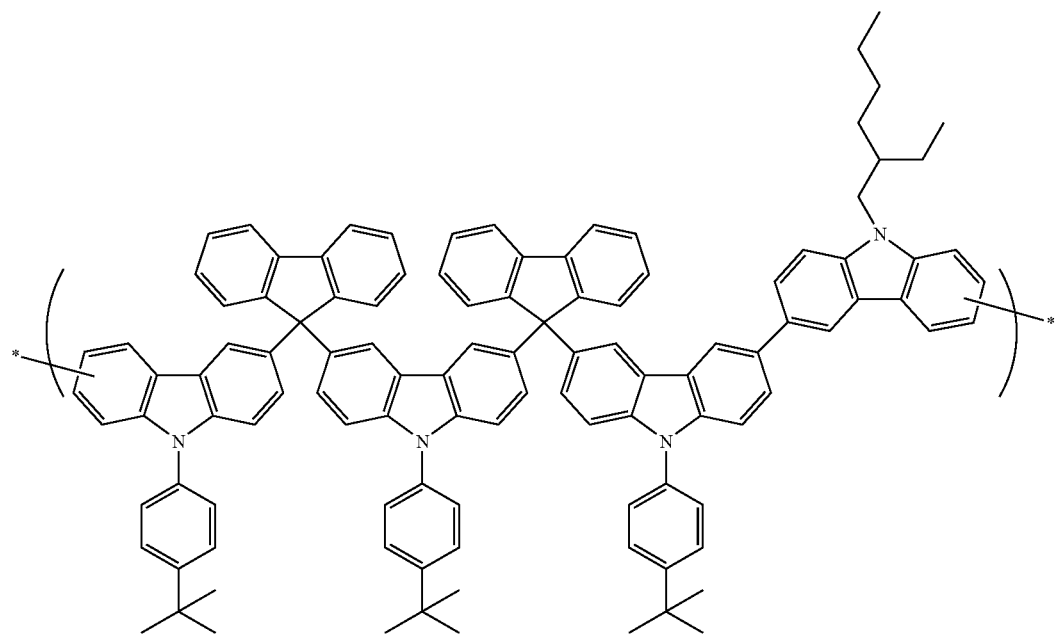

[Chemical Formula 44]
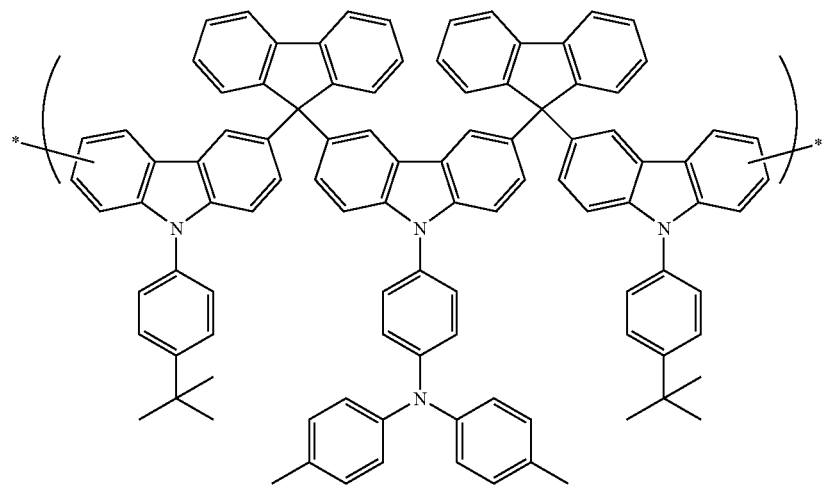
[Chemical Formula 45]
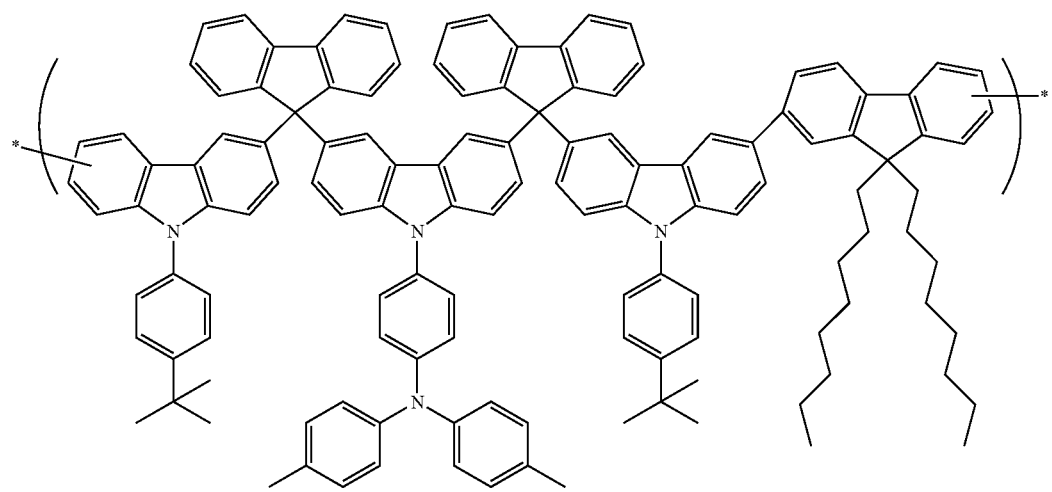
[Chemical Formula 46]
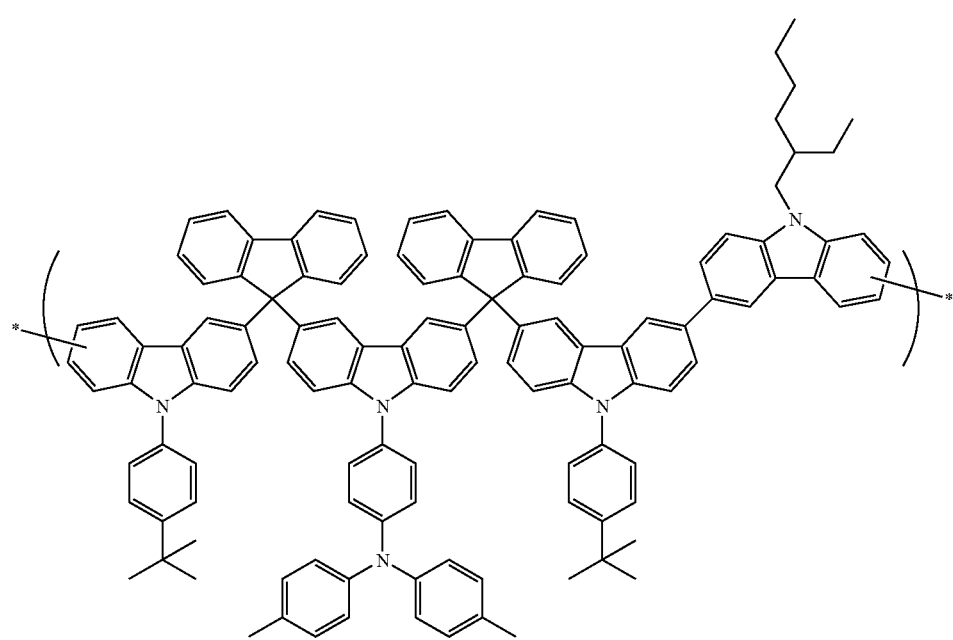

[Chemical Formula 47]
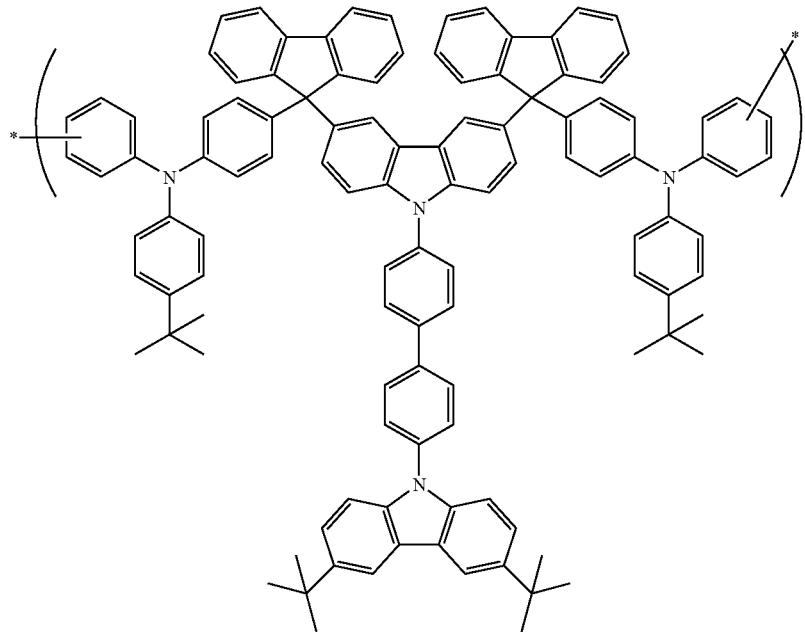
[Chemical Formula 48]
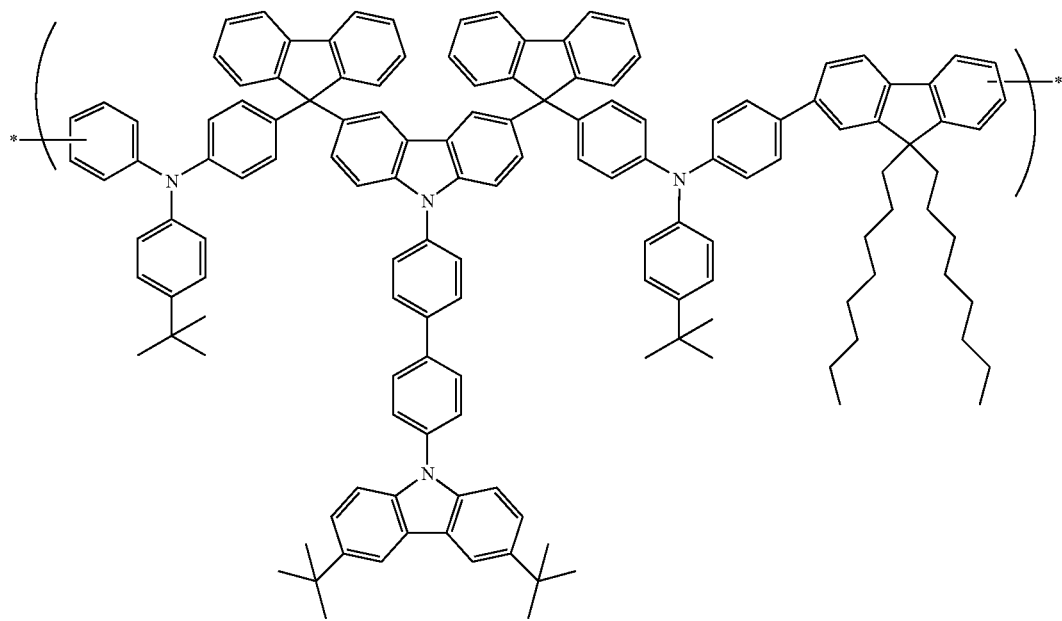

[Chemical Formula 49]
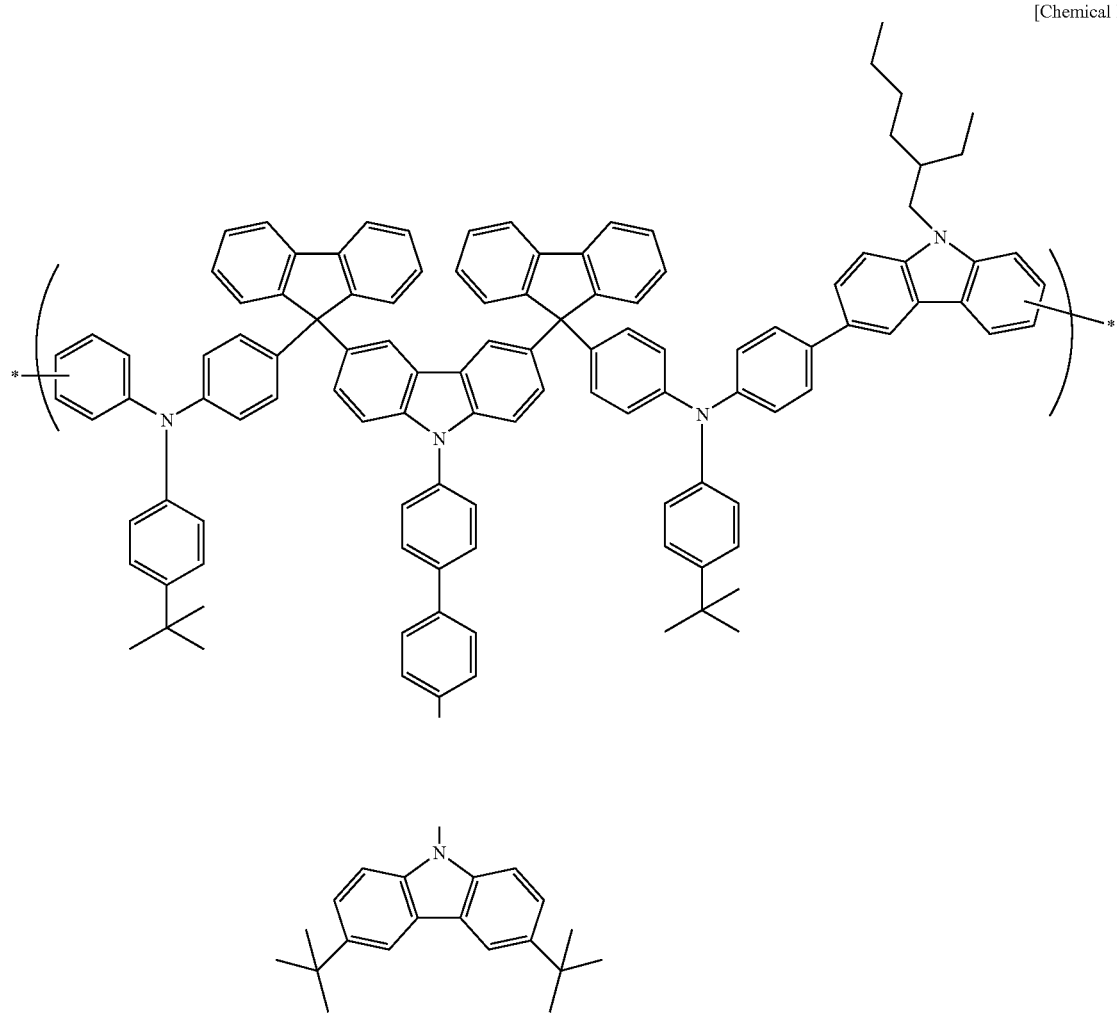
[Chemical Formula 50]
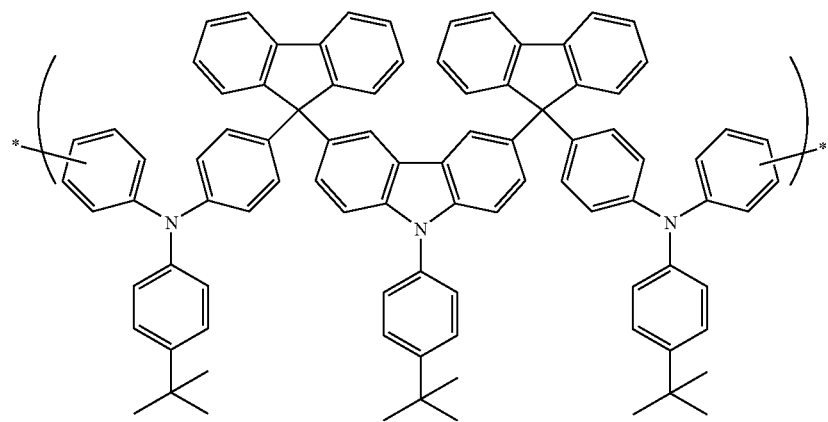

[Chemical Formula 51]
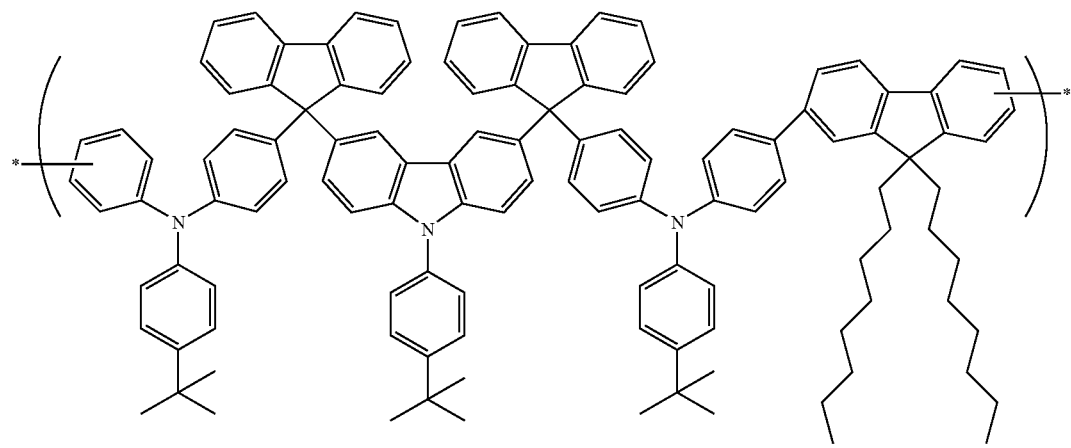
[Chemical Formula 52]
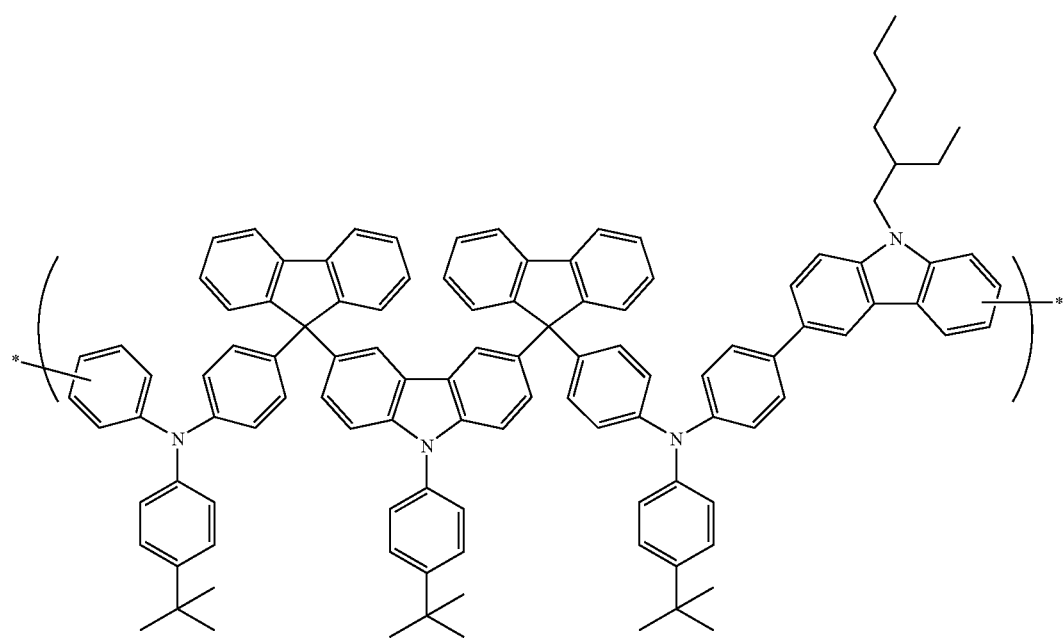
[Chemical Formula 53]
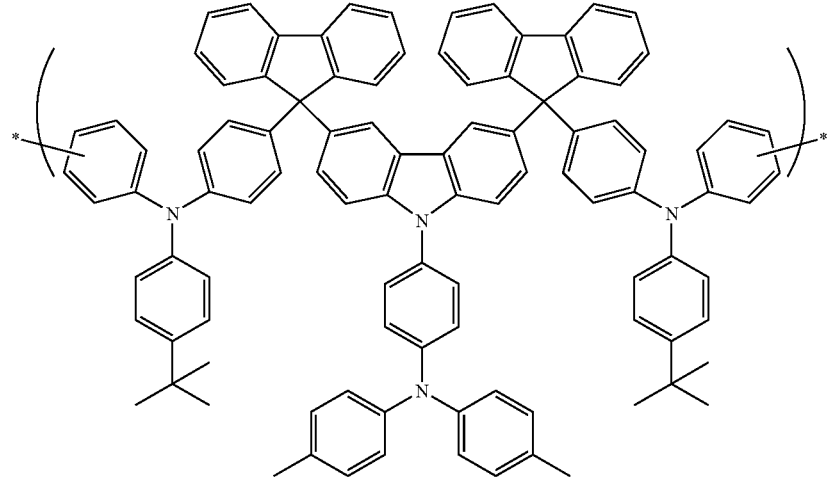

[Chemical Formula 54]
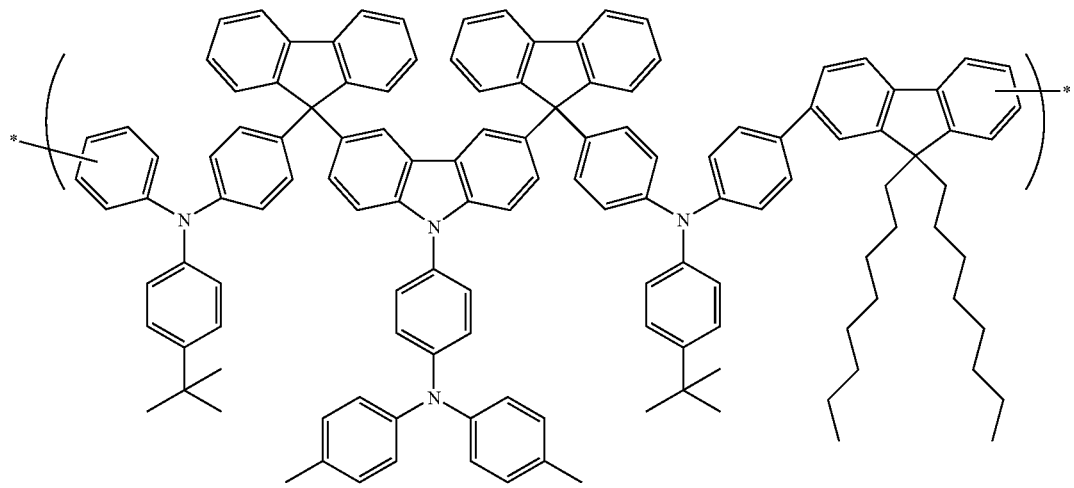
[Chemical Formula 55]
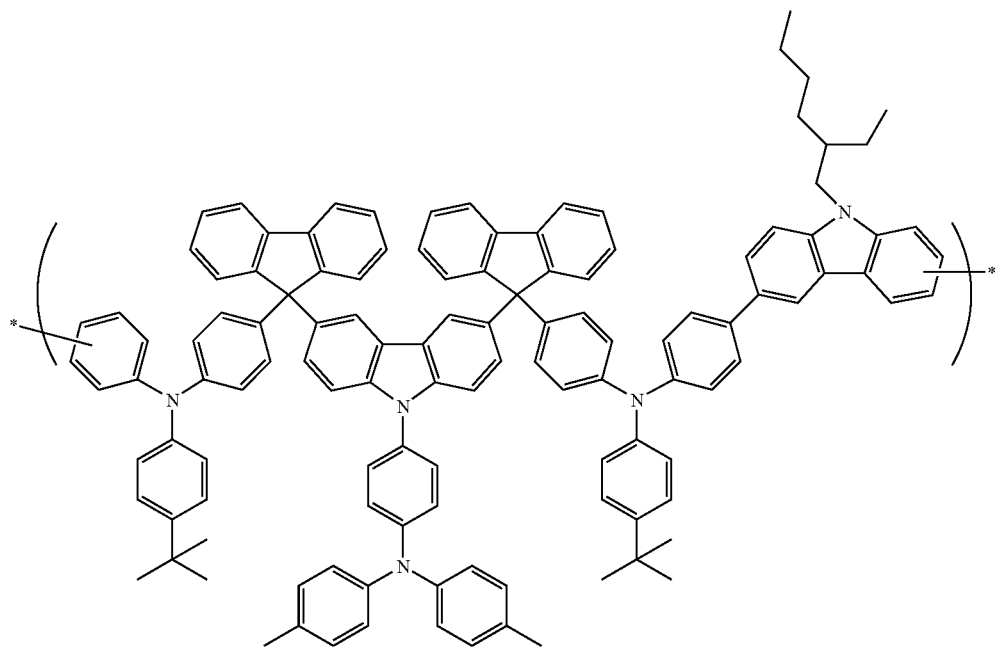
[Chemical Formula 56]
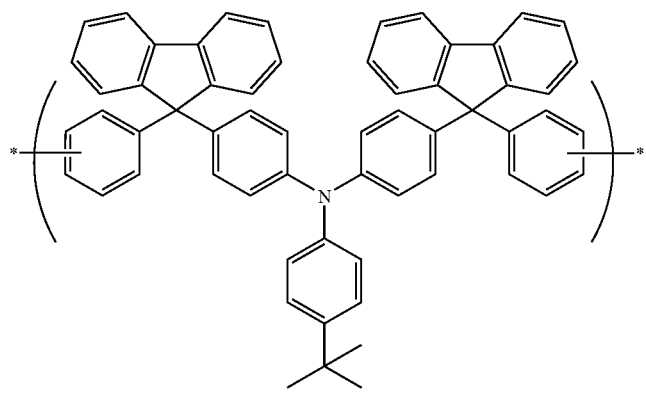

[Chemical Formula 57]
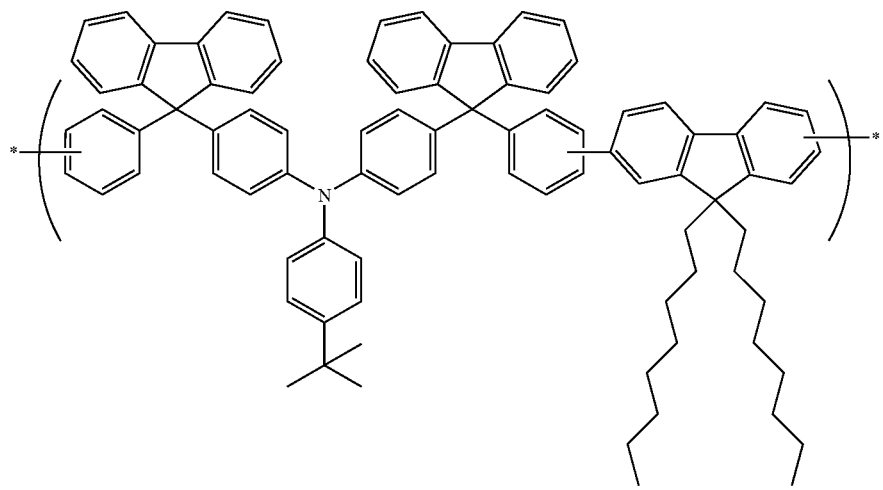
[Chemical Formula 58]
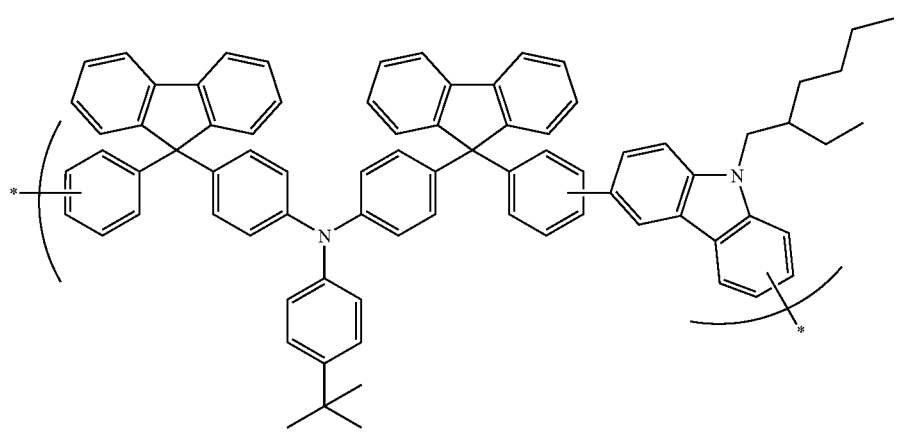
[Chemical Formula 59]
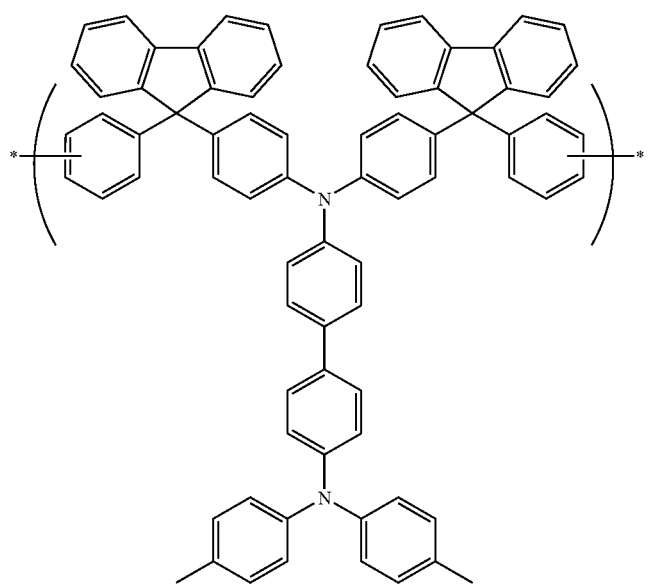

[Chemical Formula 60]
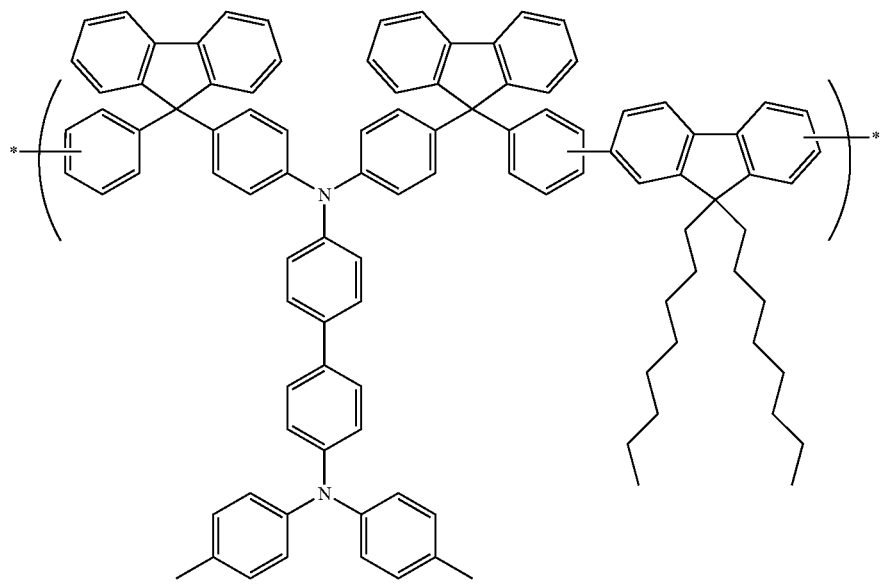
[Chemical Formula 61]
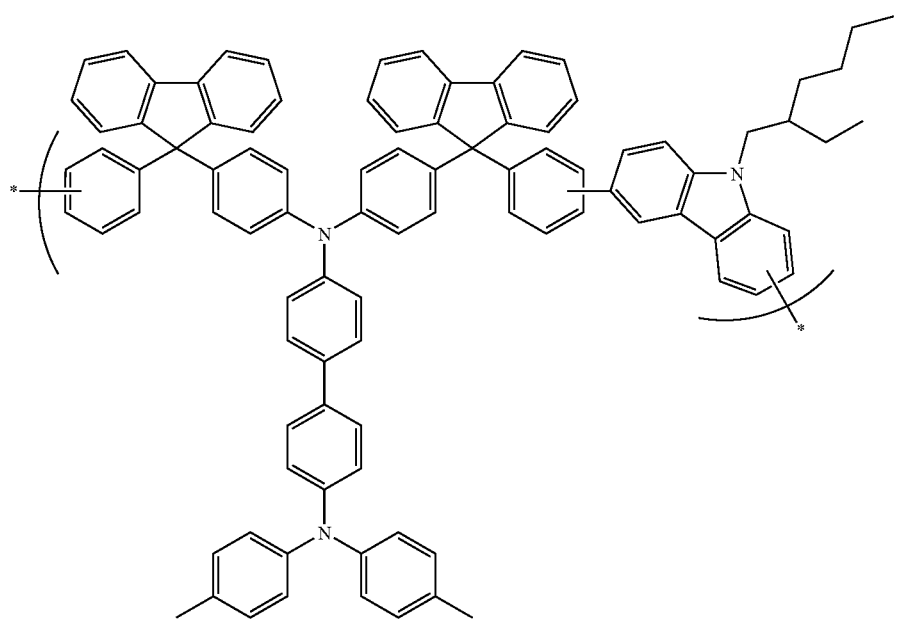
[Chemical Formula 62]
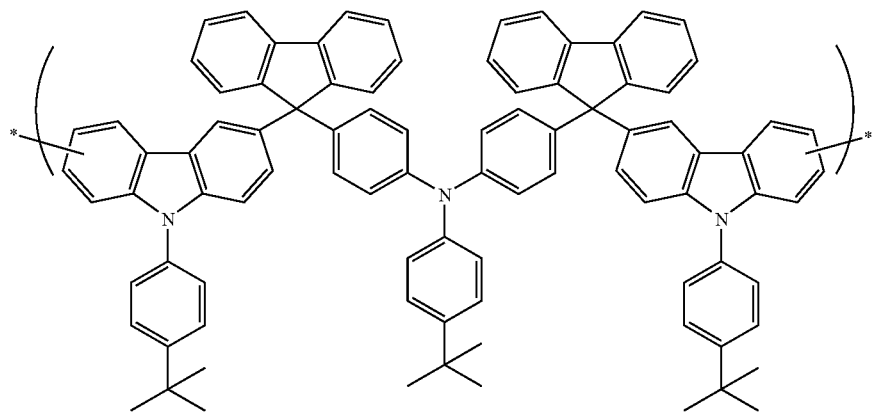

[Chemical Formula 63]
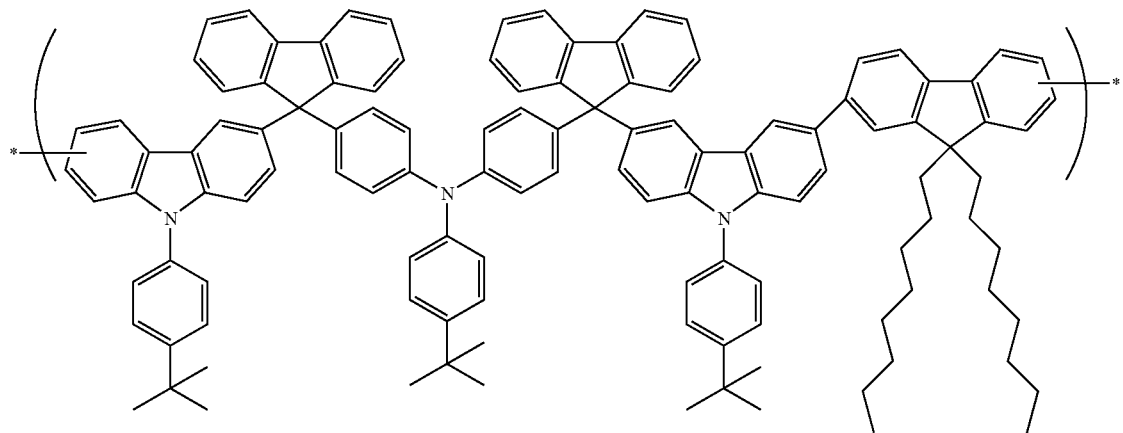
[Chemical Formula 64]
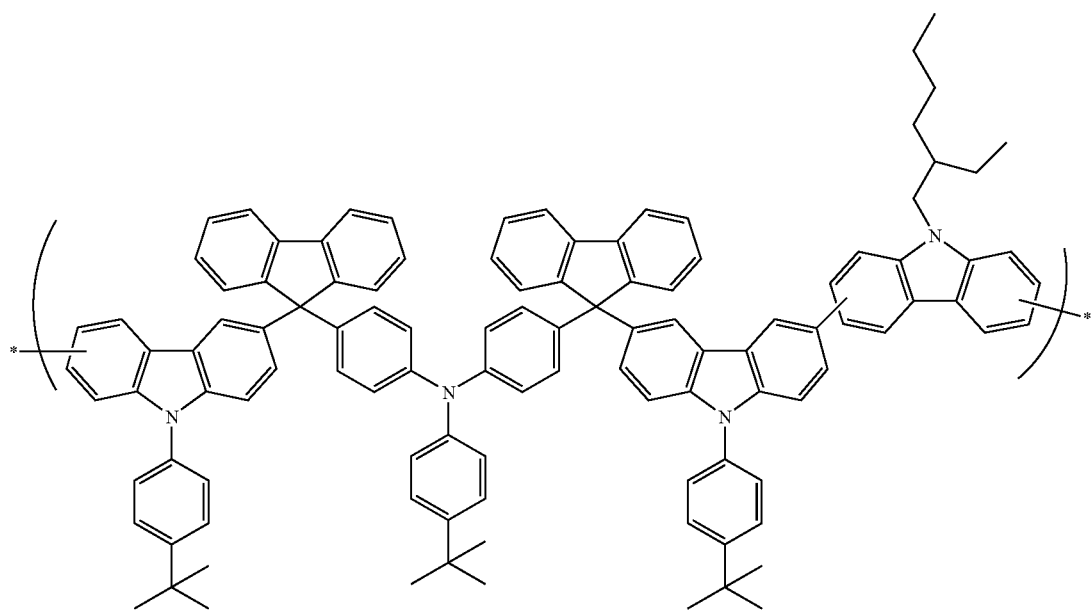
[Chemical Formula 65]
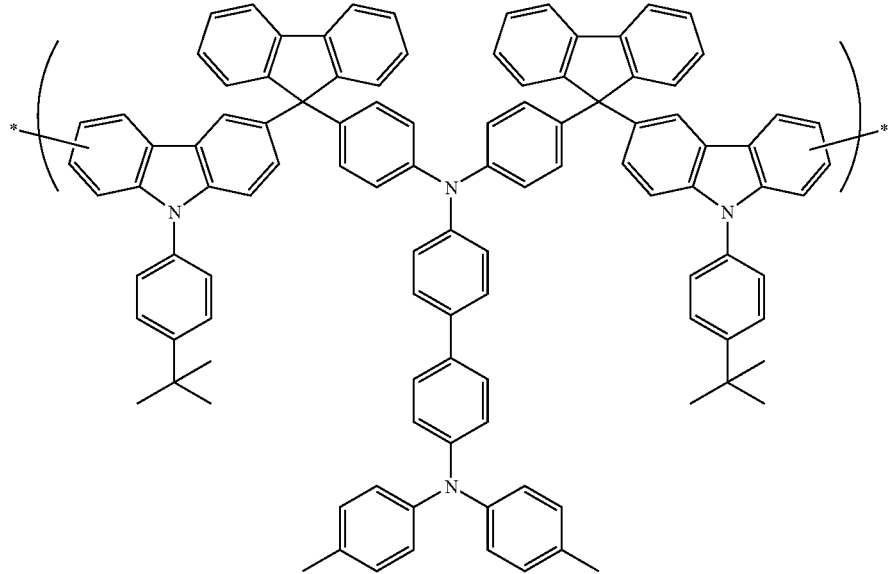

[Chemical Formula 66]
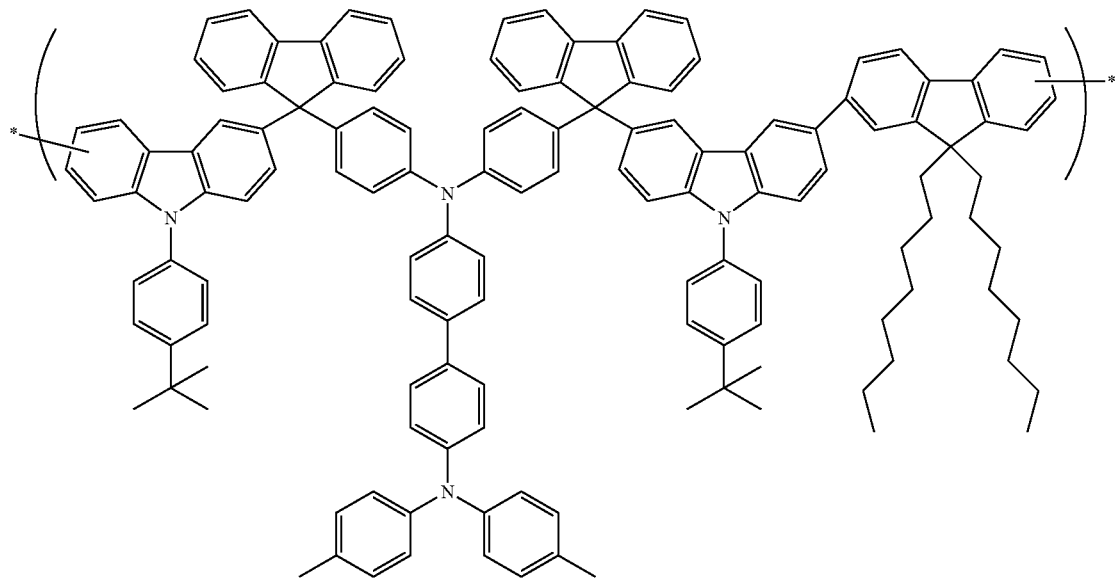
[Chemical Formula 67]
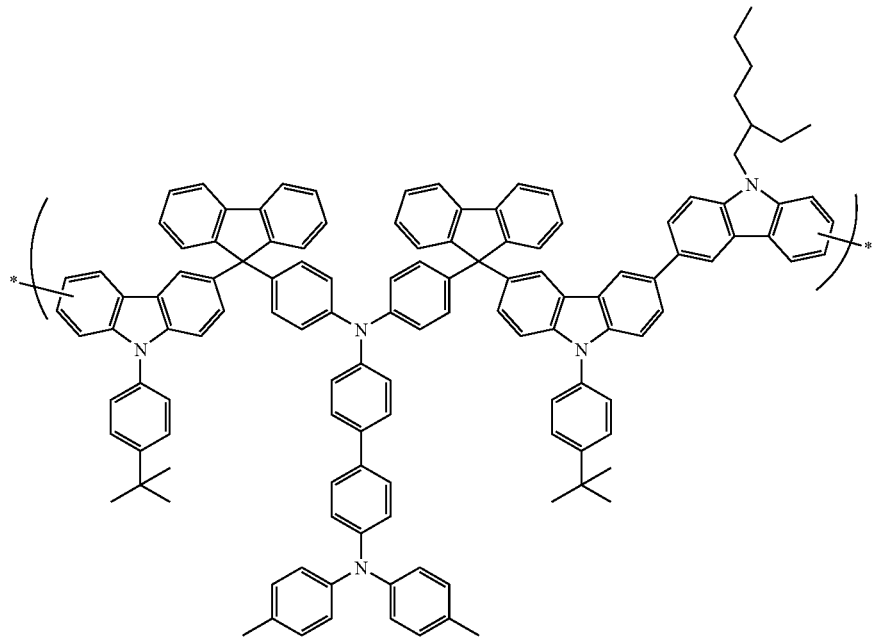
[Chemical Formula 68]
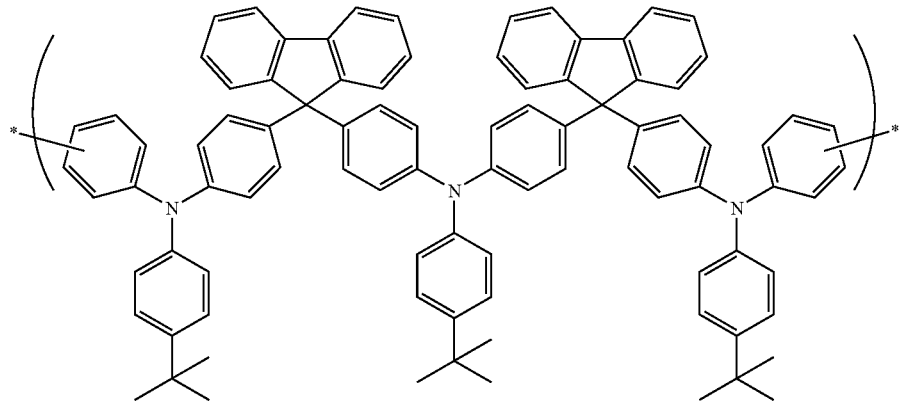

[Chemical Formula 69]
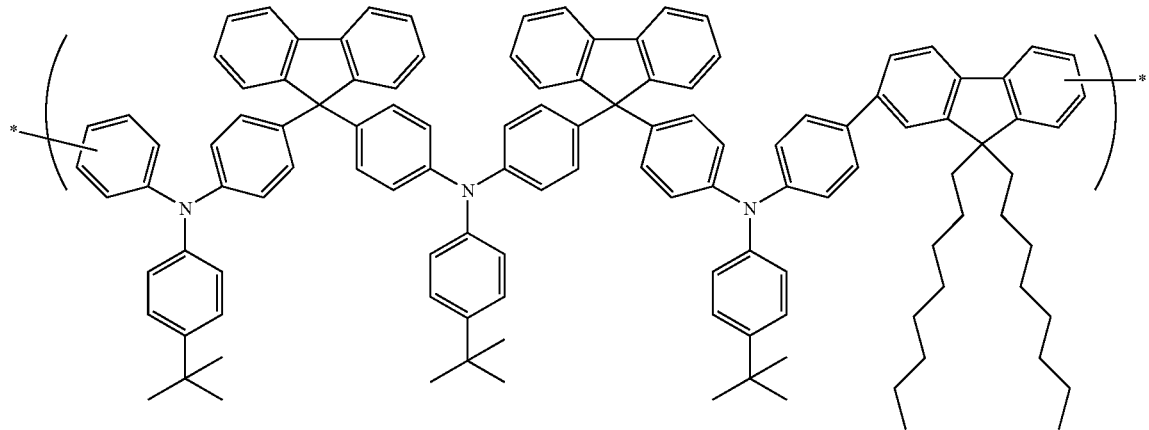
[Chemical Formula 70]
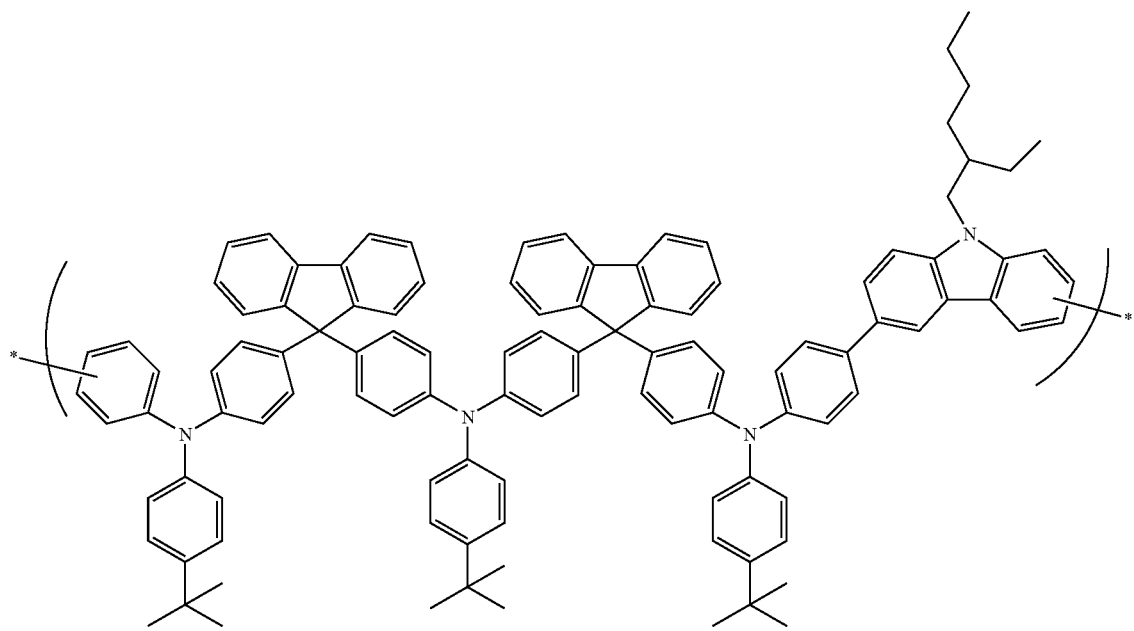
[Chemical Formula 71]
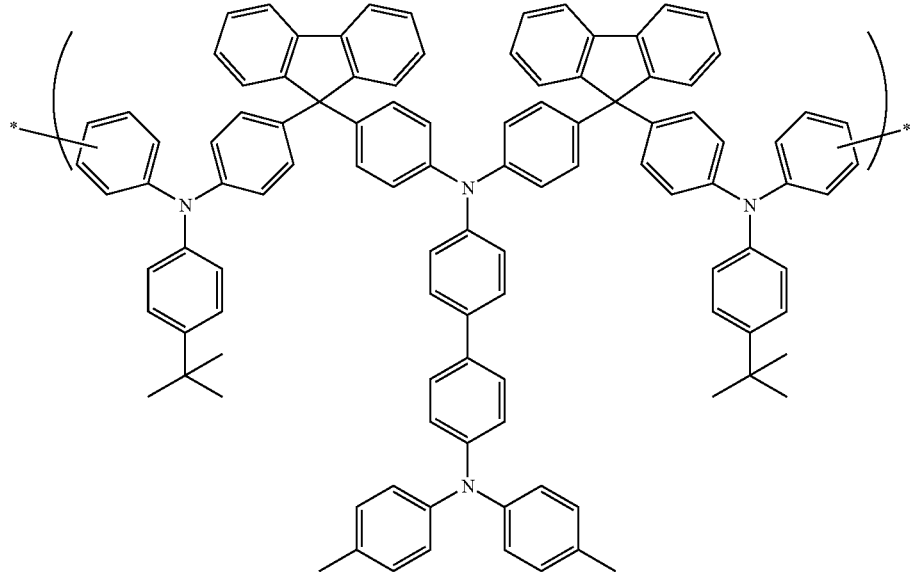

[Chemical Formula 72]

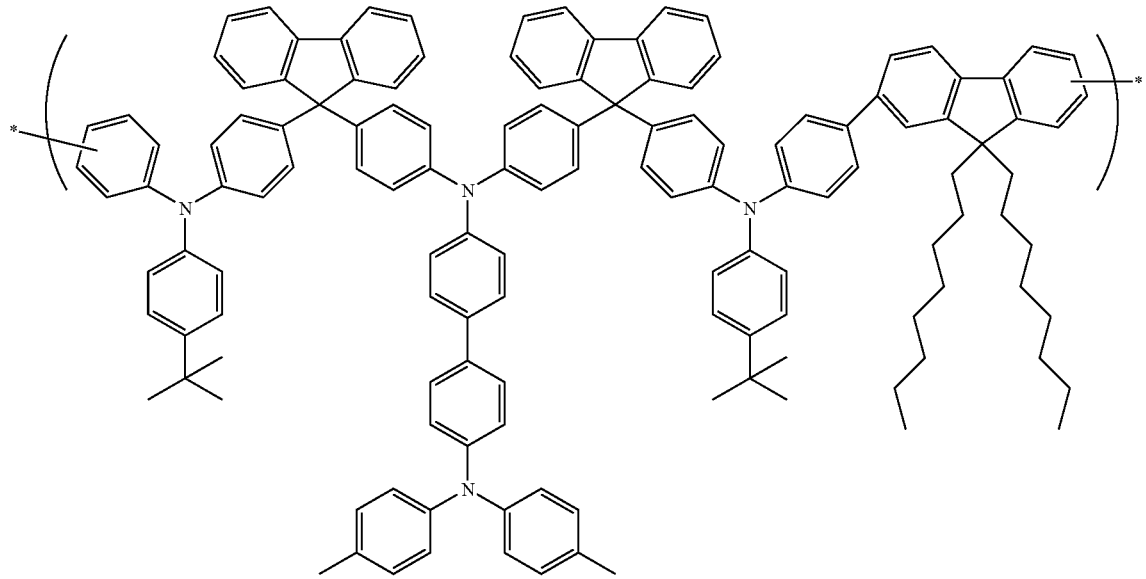

[Chemical Formula 73]

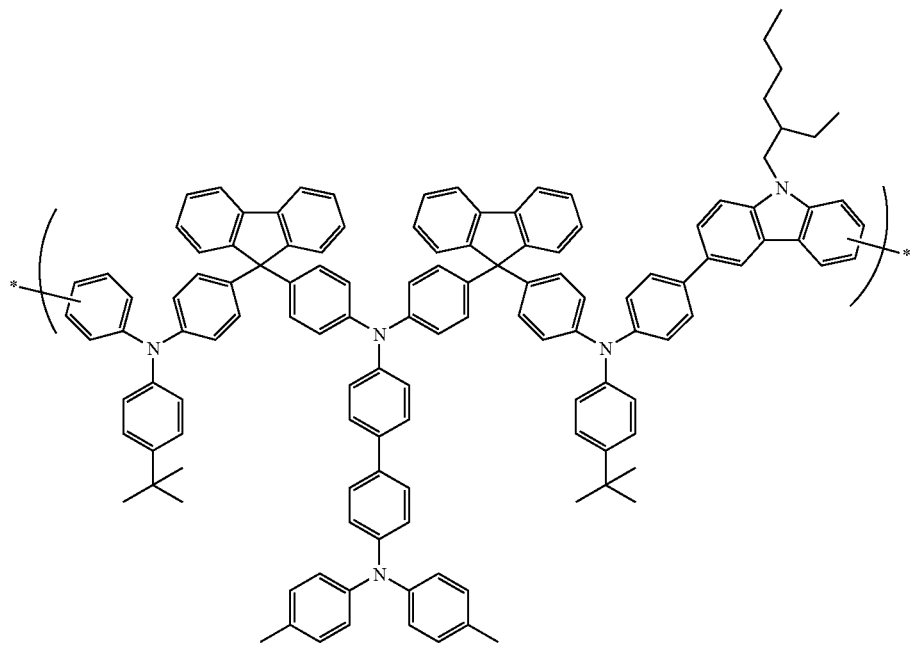

The polymers may be prepared using generally-used preparation methods. For example, the preparation method may be Yamamoto reactions, Suzuki reactions, Stille reactions, Ullman reactions, etc. Reaction temperatures, reaction solvents, and reaction times of the preparation method can be adjusted to provide the above organic compounds.

The polymer may have various molecular weights according to polymerization methods and conditions. In an embodiment, the polymer preferably has a weight average molecular weight of about 1000 to about 5,000,000, preferably about 2000 to about 2,000,000, and more preferably about 3000 to about 1,000,000.

The polymer may have a number average molecular weight of about 500 to about 2,000,000, preferably about 1000 to about 1,000,000, and more preferably about 2000 to about 500,000.

A polymer having a weight average molecular weight of about 1000 to about 5,000,000, or a number average molecular weight of about 500 to about 2,000,000, may provide a thin film having good film characteristics.

A ratio of weight average molecular weight:number average molecular weight may be 1:20, preferably 1:15, and more preferably 1:10. When the ratio of the weight average molecular weight/number average molecular weight is near 1, a polymer is theoretically synthesized well.

Another embodiment provides an organic photoelectric device that includes an organic layer including the above-described organic compounds between a pair of electrodes. In one embodiment, the organic photoelectric device may be an organic light emitting diode.

The organic layer may be an emission layer, a hole injection layer (HIL), a hole transport layer (HTL), an electron transport layer (ETL), an electron injection layer (EIL), an interlayer, a hole blocking layer, etc.

The organic photoelectric device may include an interlayer, a hole transport layer (HTL), an electron transport layer (ETL), etc., as well as a basic device structure of anode/emission layer/cathode.

FIG. 1 illustrates a cross-sectional view of an organic photoelectric device 1 according to a first embodiment. FIG. 1 shows the organic photoelectric device 1 including a substrate 11, an anode 12, a hole transport layer (HTL) 13, an emission layer 14, an electron transport layer (ETL) 15, and a cathode 16.

Referring to FIG. 1, the organic photoelectric device may be fabricated using the organic compounds according to an embodiment as follows.

First, an anode 12 material may be coated on an upper side of the substrate 11.

The substrate 11 may be, e.g., a glass substrate or a transparent plastic substrate having excellent general transparence, face smoothness, handling ease, and water repellency.

The anode 12 material may include transparent and highly conductive indium tin oxide (ITO), tin oxide ($SnO_2$), zinc oxide (ZnO), etc.

Next, a hole transport layer (HTL) 13 may be disposed on the anode 12 using, e.g., vacuum deposition, sputtering, or spin coating, and an emission layer 14 may be disposed on the hole transport layer (HTL) 13 using, e.g., vacuum deposition, or a solution coating method such as spin coating, inkjet printing, etc.

An electron transport layer (ETL) 15 may be disposed between the emission layer 14 and the cathode 16.

The emission layer 14 may be a thickness ranging from about 5 nm to about 1 μm, and preferably about 10 to about 500 nm, and the hole transport layer (HTL) 13 and electron transport layer (ETL) 15 may respectively have a thickness ranging from about 10 to about 10,000 Å.

The electron transport layer (ETL) 15 may be formed using, e.g., vacuum deposition, sputtering, or spin coating operations generally used for electron transport layer (ETL) 15 materials.

The hole transport layer (HTL) 13 and electron transport layer (ETL) 15 may help efficiently transport a carrier to the emission layer 14 to heighten light emitting recombination in the emission layer 14.

The hole transport layer (HTL) 13 material may include, e.g., poly(3,4 ethylenedioxy-thiophene) (PEDOT) doped with poly(styrenesulfonic acid) (PSS), and/or N,N'-bis(3-methylphenyl)-N,N-diphenyl-[1,1'-biphenyl]-4,4'-diamine (TPD).

The electron transport layer (ETL) 15 material may include, e.g., aluminum trihydroxyquinoline ($Alq_3$), a 1,3,4-oxadiazole derivative such as 2-(4-biphenylyl-5-phenyl-1,3,4-oxadiazole (PBD), a quinoxaline derivative such as 1,3,4-tris[(3-phenyl-6-trifluoromethyl)quinoxalin-2-yl] benzene (TPQ), and/or a triazole derivative.

The polymer may be mixed with a phosphorescent light emitting organic compound. The phosphorescent organic compound may be a phosphorescent light emitting organic metal complex from its triplet state, and is preferably a metal complex of at least one group VIII metal ion selected from Fe, Co, Ni, Ru, Rh, Pd, Os, Ir, and Pt, and is more preferably Ir or Pt.

Examples of the metal complex may be represented by the following Formulae 74 to 76:

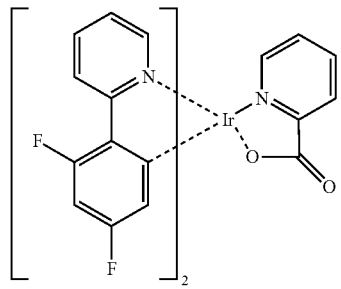

[Chemical Formula 74]

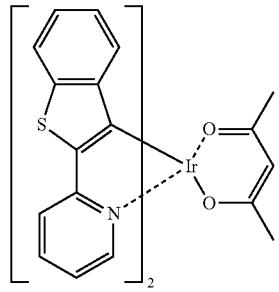

[Chemical Formula 75]

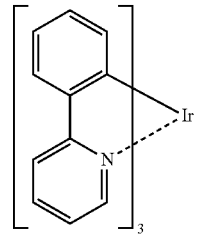

[Chemical Formula 76]

When the organic layer including the organic compound is formed using a solution coating, another low molecular weight host material may be included along with the organic compound according to an embodiment.

Examples of the other low molecular host material may include compounds of the following Formulae 77 to 80:

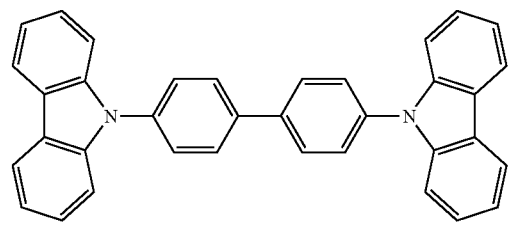

[Chemical Formula 77]

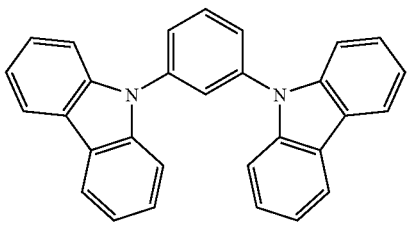

[Chemical Formula 78]

59
-continued

[Chemical Formula 79]

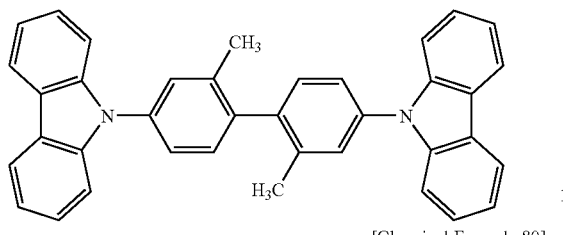

[Chemical Formula 80]

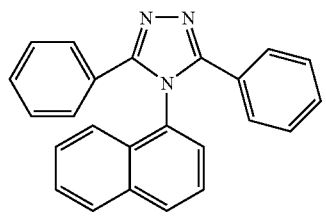

The polymer according to an embodiment may be used by mixing with other polymers having conjugated double bonds such as fluorene-based polymers, polyphenylenevinylene-based polymers, and polyparaphenylene-based polymers, and also by mixing with binder resins. The binder resins may include polyvinylcarbazole (PVK), polycarbonate, polyester, polyan arylate, polystyrene, acryl polymers, methacryl polymers, polybutyral, polyvinylacetal, diallylphthalate polymers, phenol resins, epoxy resins, silicone resins, polysulfone resins, or urea resins. Such binder resins may be used singularly and in combination.

A hole blocking layer may be disposed using vacuum deposition to limit a transport speed of holes into the emission layer 14 and thus to increase recombination opportunity of electrons and holes.

A material for the cathode 16 may be coated on the electron transport layer (ETL).

The cathode material may be, e.g., lithium (Li), magnesium (Mg), calcium (Ca), aluminum (Al), Al:Li, Ba:Li, or Ca:Li having a small work function.

The following Examples are provided in order to set forth particular details of one or more embodiments. However, it will be understood that the embodiments are not limited to the particular details described.

In the following Examples 1 to 5, monomers M-1 to M-5 for preparing a polymer according to an embodiment were respectively prepared as shown in Reaction Schemes 1 to 5.

EXAMPLE 1

Synthesis of M-1

[Reaction Scheme 1]

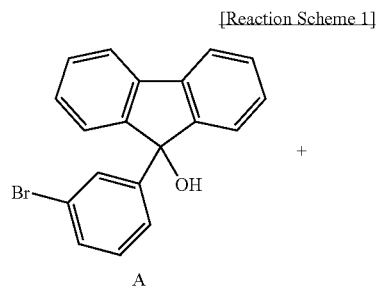

60
-continued

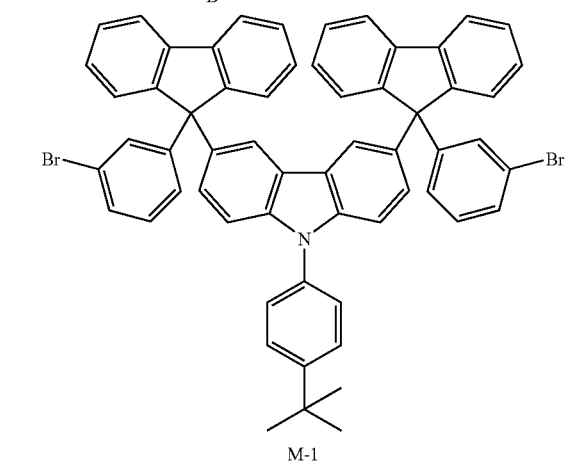

6.0 g (17.79 mmol) of 9-(3-bromophenyl)-9-H-fluorene-9-ol (A) and 2.13 g (7.11 mmol) of 9-4-tert-butylphenyl)9-H-carbazole (B) were dissolved in 40 mL of methylene chloride under a nitrogen atmosphere, and 3 mL of a boron trifluoride diethylether complex (BF$_3$.OEt$_2$) was slowly added thereto. The mixture was agitated at room temperature for 12 hours, and 50 mL of water was added thereto, completing the reaction. The resulting mixture was extracted with methylene chloride and washed four times with water. The extraction solution was dried with anhydrous magnesium sulfate. The dried solution was treated to remove the solvent under reduced pressure. The resulting product was purified through a silica gel column with a solvent of methylene chloride/hexane mixed in a ratio of 1:3, obtaining 5.0 g (56.2%) of white M-1.

EXAMPLE 2

Synthesis of M-2

[Reaction Scheme 2]

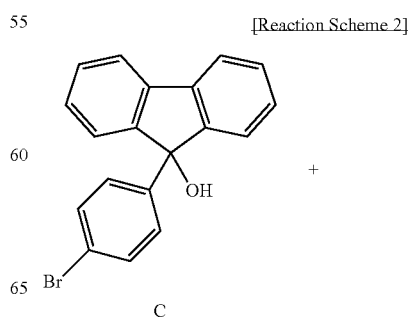

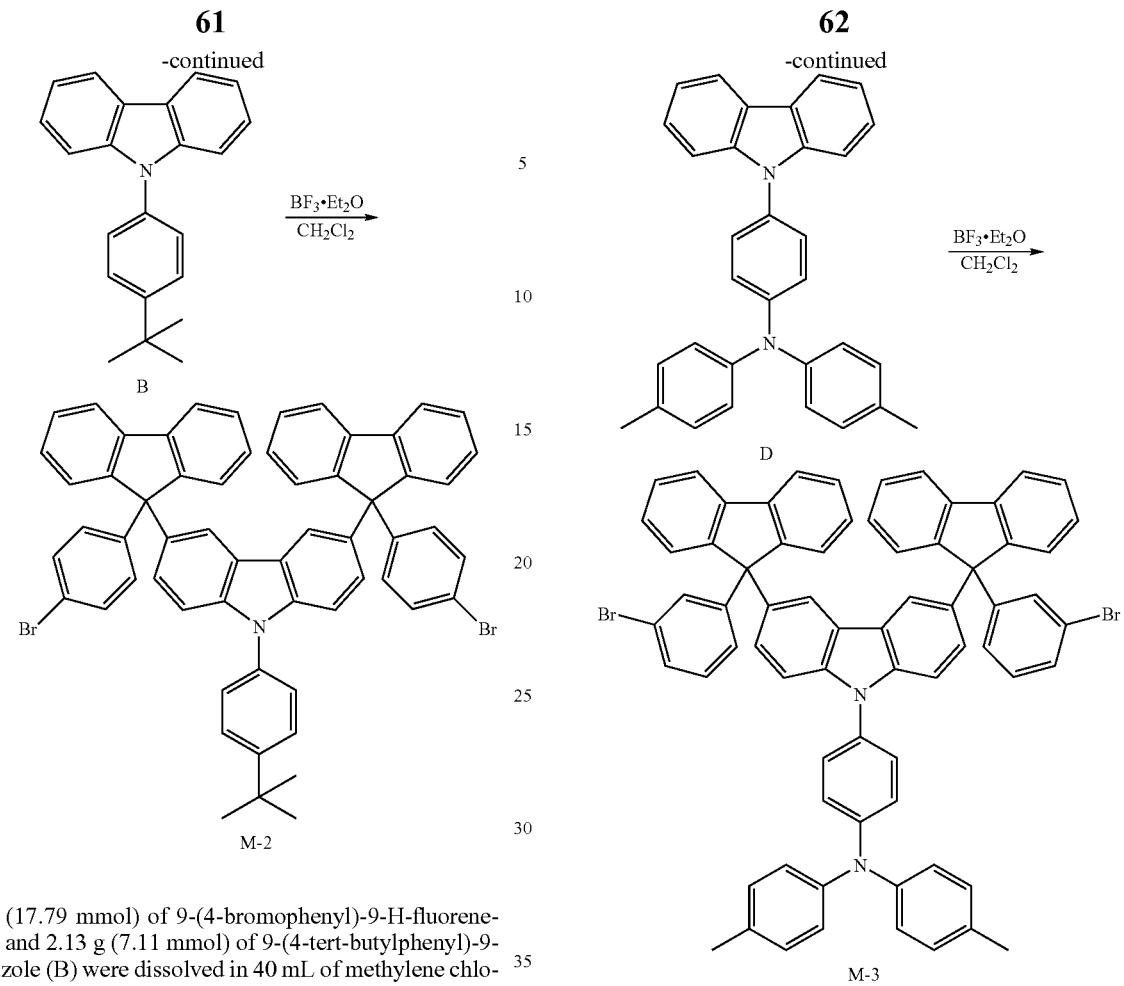

6.0 g (17.79 mmol) of 9-(4-bromophenyl)-9-H-fluorene-9-ol (C) and 2.13 g (7.11 mmol) of 9-(4-tert-butylphenyl)-9-H-carbazole (B) were dissolved in 40 mL of methylene chloride under a nitrogen atmosphere, and 3 mL of a boron trifluoride diethylether complex ($BF_3 \cdot OEt_2$) was slowly added thereto. The mixture was agitated at room temperature for 12 hours, and 50 mL of water was added thereto, completing the reaction. The resulting mixture was extracted with methylene chloride and washed four times with water. The extraction solution was dried with anhydrous magnesium sulfate. The dried solution was treated under reduced pressure to remove the solvent. The resulting product was purified through a silica gel column with a solvent of methylene chloride/hexane mixed in a ratio of 2:3, obtaining 5.0 g (75%) of white M-2.

EXAMPLE 3

Synthesis of M-3

[Reaction Scheme 3]

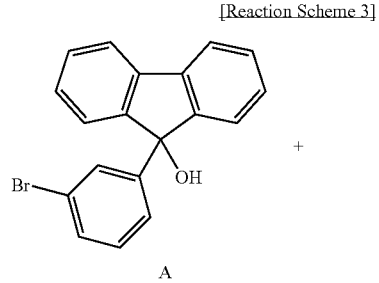

3.0 g (8.89 mmol) of 9-(3-bromophenyl)-9-H-fluorene-9-ol (A) and 1.77 g (4.04 mmol) of a material D were dissolved in 50 mL of methylene chloride, and 1.5 mL of a boron trifluoride diethylether complex ($BF_3 \cdot OEt_2$) was slowly added thereto in a dropwise fashion. The mixture was agitated at room temperature for 12 hours, and 50 mL of water was added thereto, completing the reaction. The resulting mixture was extracted with methylene chloride and washed four times with water. Then, the extraction solution was dried with anhydrous magnesium sulfate. The dried solution was treated under reduced pressure to remove the solvent and then purified through a silica gel column with a solvent of methylene chloride/hexane mixed in a ratio of 1:2, obtaining 3.3 g (75.8%) of white M-3.

EXAMPLE 4

Synthesis of M-4

[Reaction Scheme 4]

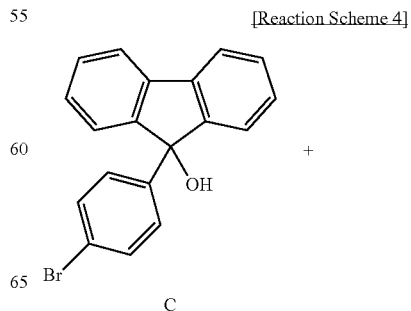

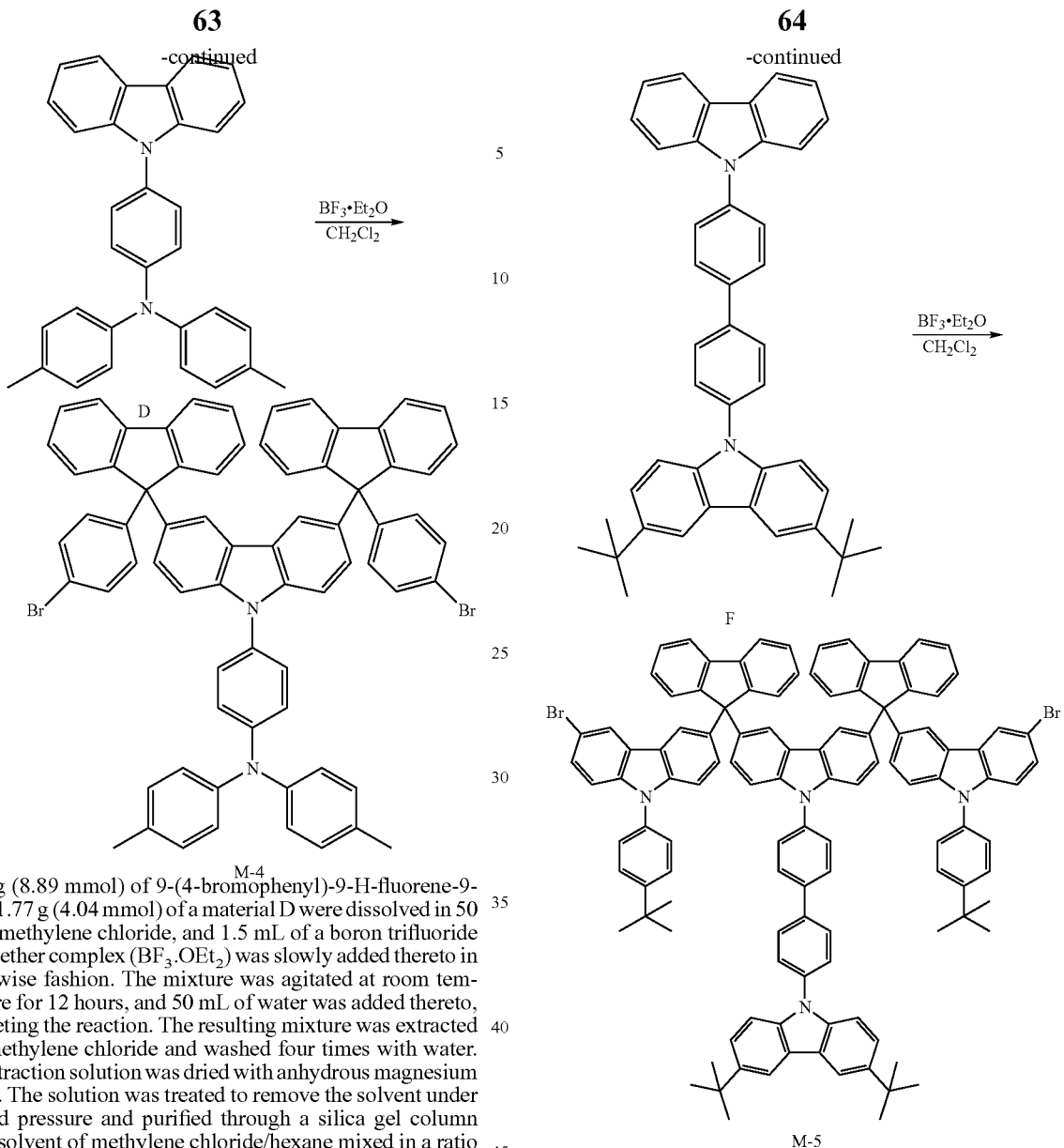

3.0 g (8.89 mmol) of 9-(4-bromophenyl)-9-H-fluorene-9-ol and 1.77 g (4.04 mmol) of a material D were dissolved in 50 mL of methylene chloride, and 1.5 mL of a boron trifluoride diethylether complex (BF$_3$.OEt$_2$) was slowly added thereto in a dropwise fashion. The mixture was agitated at room temperature for 12 hours, and 50 mL of water was added thereto, completing the reaction. The resulting mixture was extracted with methylene chloride and washed four times with water. The extraction solution was dried with anhydrous magnesium sulfate. The solution was treated to remove the solvent under reduced pressure and purified through a silica gel column with a solvent of methylene chloride/hexane mixed in a ratio of 1:2, obtaining 3.0 g (69%) of white M-4.

EXAMPLE 5

Synthesis of M-5

[Reaction Scheme 5]

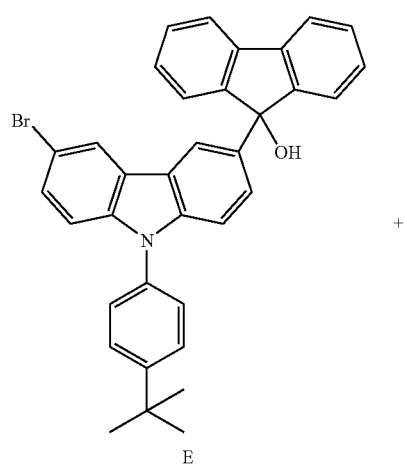

4.11 g (7.37 mmol) of a material E and 2.0 g (3.35 mmol) of a material F were dissolved in 40 mL of methylene chloride under a nitrogen atmosphere, and 1.5 mL of a boron trifluoride diethylether complex (BF$_3$.OEt$_2$) was slowly added thereto in a dropwise fashion. The mixture was agitated at room temperature for 12 hours, and 50 mL of water was added thereto, completing the reaction. The resulting mixture was extracted with methylene chloride and washed four times with water. The extraction solution was dried with anhydrous magnesium sulfate. The dried solution was treated under reduced pressure to remove the solvent and purified through a silica gel column with a solvent of methylene chloride/hexane mixed in a ratio of 1:2, obtaining 4.1 g (73%) of white M-5.

In the following Examples 6 to 10, polymers CISH-1 to CISH-5 according to embodiments were respectively prepared as shown in Reaction Schemes 6 to 10.

EXAMPLE 6

Synthesis of Polymer CISH-1

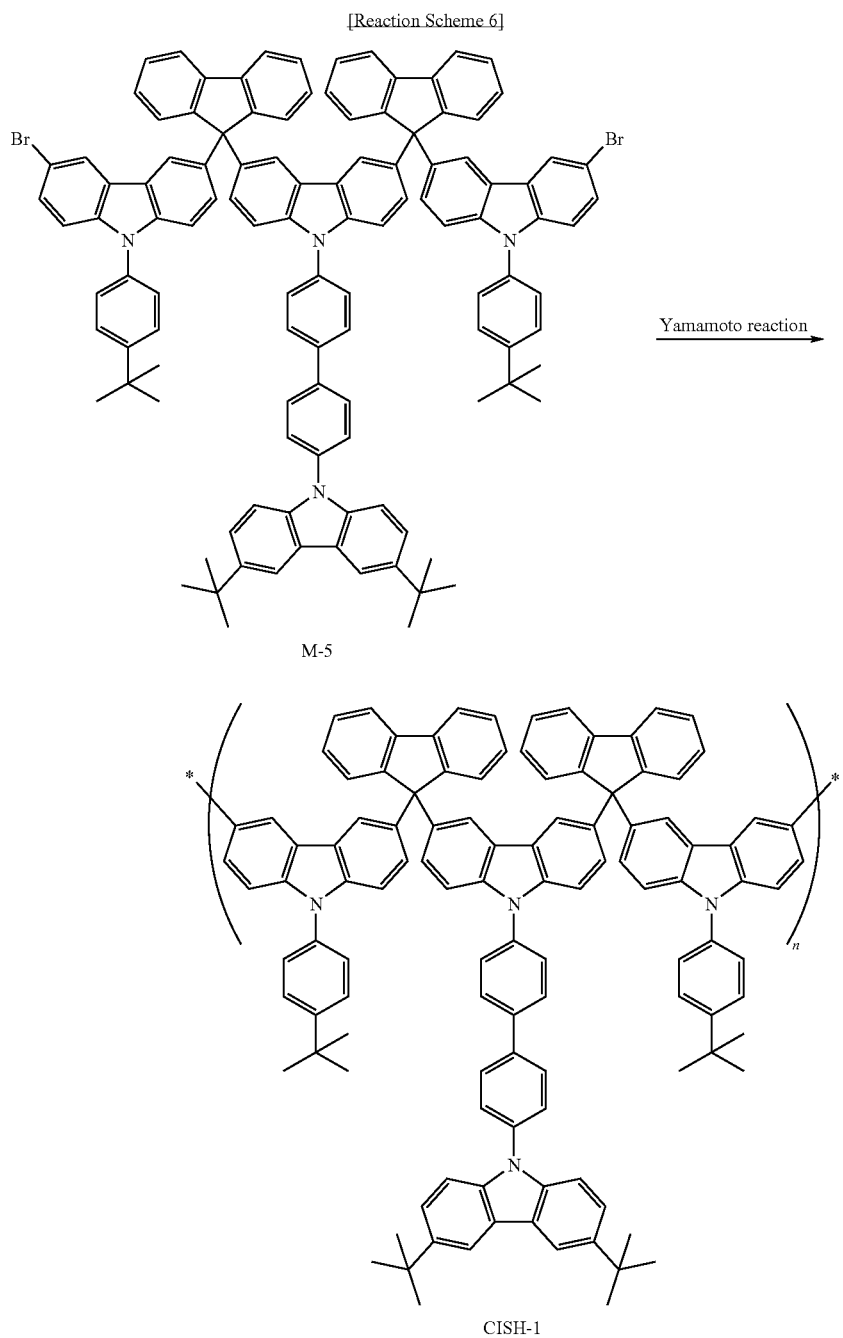

0.7 g (0.41 mmol) of the monomer M-5 prepared under a nitrogen atmosphere, 279.4 mg of bis(1,5-cyclooctadiene)-nickel), 0.12 mL of cyclooctadiene, and 158 mg of 2,2'-bipyridine were dissolved in a mixed solvent of DMF/toluene (8 mL/4 mL) in a 100 ml round flask with a thermometer, a reflux condenser, and an agitator. The solution was agitated at 70° C. for 48 hours. The agitated reactant was precipitated in methanol, obtaining a white polymer. The polymer was filtered and dissolved in chloroform, and then re-precipitated in methanol.

The re-precipitated polymer was purified with acetone for 24 hours using a Soxhlet device, obtaining 0.4 g of white CISH-1.

This polymer had a light-emitting maximum wavelength of 408 nm when in chloroform solution.

EXAMPLE 7

Synthesis of Polymer CISH-2

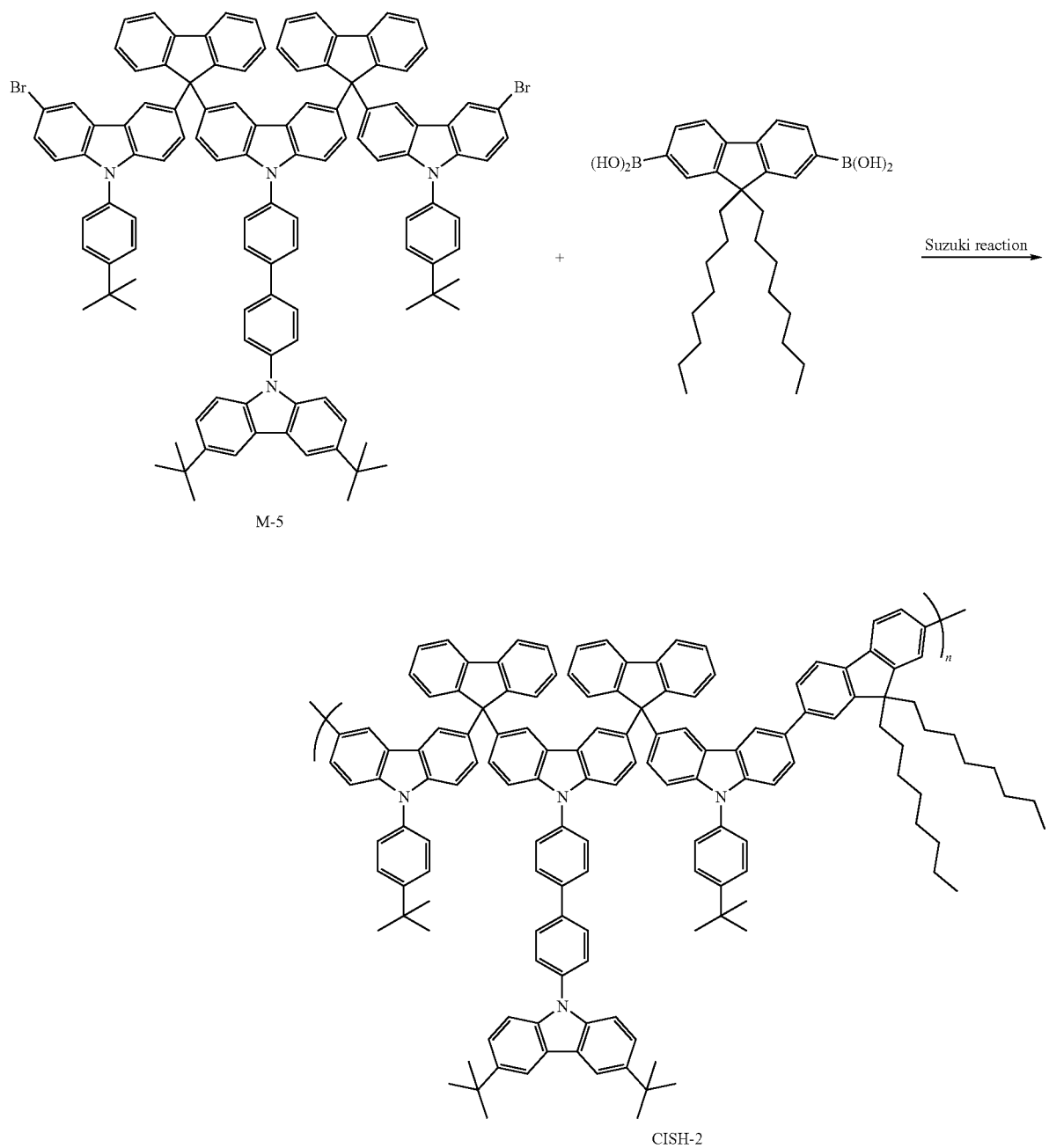

0.6 g (0.35 mmol) of the monomer M-5, 0.17 g (0.35 mmol) of 9,9-dioctylfluorene-2,7-diboronic acid, and 0.05 g (0.043 mmol) of tetrakis(triphenylphosphine)palladium were dissolved in 10 mL of tetrahydrofuran (THF) in a 100 ml round flask with a thermometer, a reflux condenser, and an agitator under an argon atmosphere, and 5 mL of 20% tetraethyl ammonium hydroxide was added thereto. The resulting mixture was agitated at 75° C. for 48 hours. The agitated reactant was precipitated in methanol, preparing a light yellow polymer. The polymer was filtered and redissolved in chloroform, and then re-precipitated in methanol.

The re-precipitated polymer was purified for 24 hours with methanol using a Soxhlet device, obtaining 0.5 g of light yellow CISH-2.

EXAMPLE 8
Synthesis of Polymer CISH-3
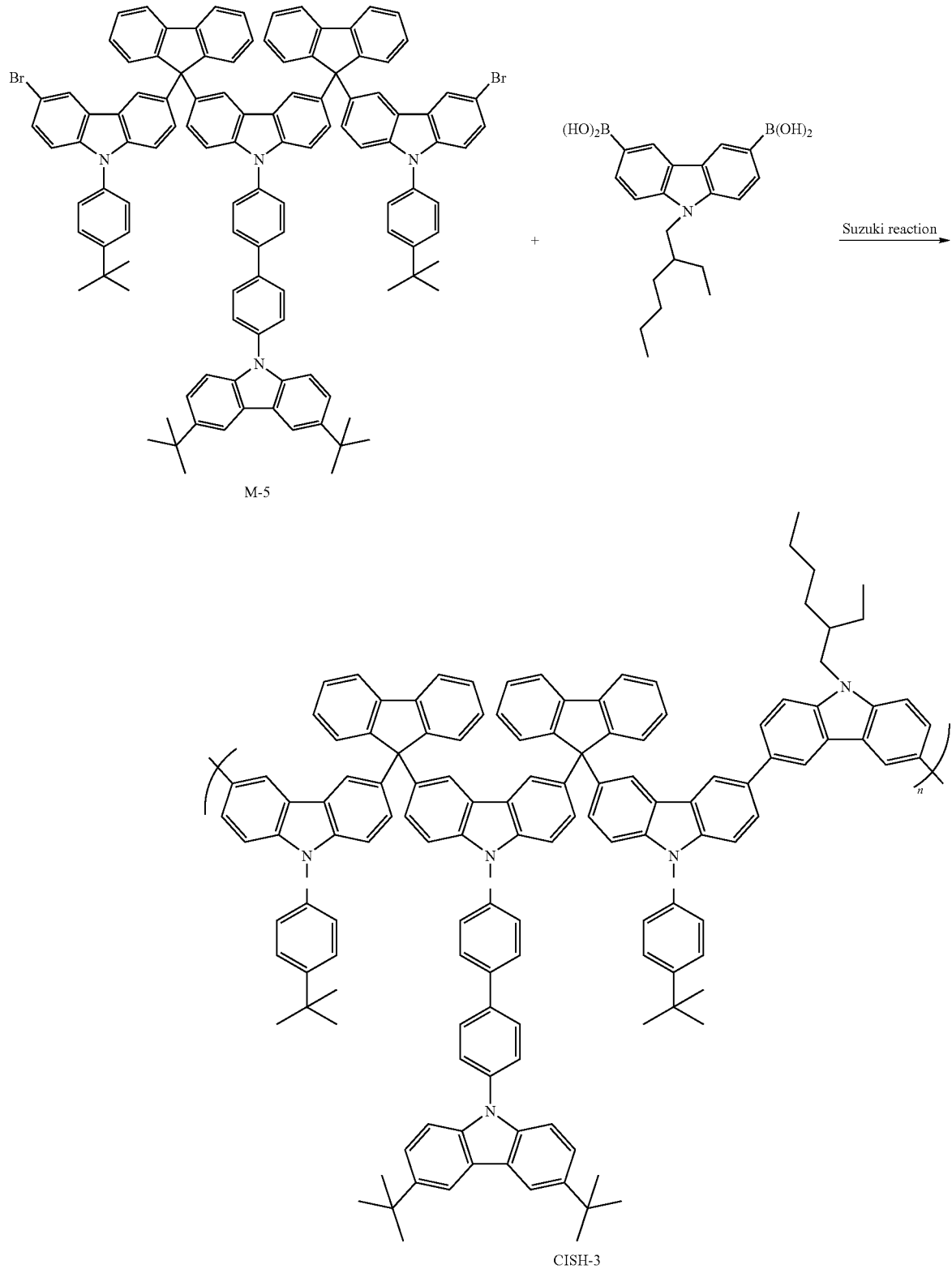

0.6 g (0.35 mmol) of the monomer M-5, 0.128 g (0.35 mmol) of 9-ethylhexylcarbazole-3,6-diboronic acid, and 0.05 g (0.043 mmol) of tetrakis(triphenylphosphine)palladium were dissolved in 10 mL of tetrahydrofuran in a 100 ml round flask with a thermometer, a reflux condenser, and an agitator under an argon atmosphere, and 5 mL of 20% tetraethyl ammonium hydroxide was added thereto. The resulting mixture was agitated at 75° C. for 48 hours. The agitated reactant was precipitated in methanol, obtaining a light yellow polymer. Then, it was filtered and dissolved in chloroform, and then re-precipitated in methanol.

The re-precipitated polymer was filtered and purified for 24 hours using a Soxhlet device, obtaining 0.44 g of light yellow CISH-3.

EXAMPLE 9

Synthesis of Polymer CISH-4

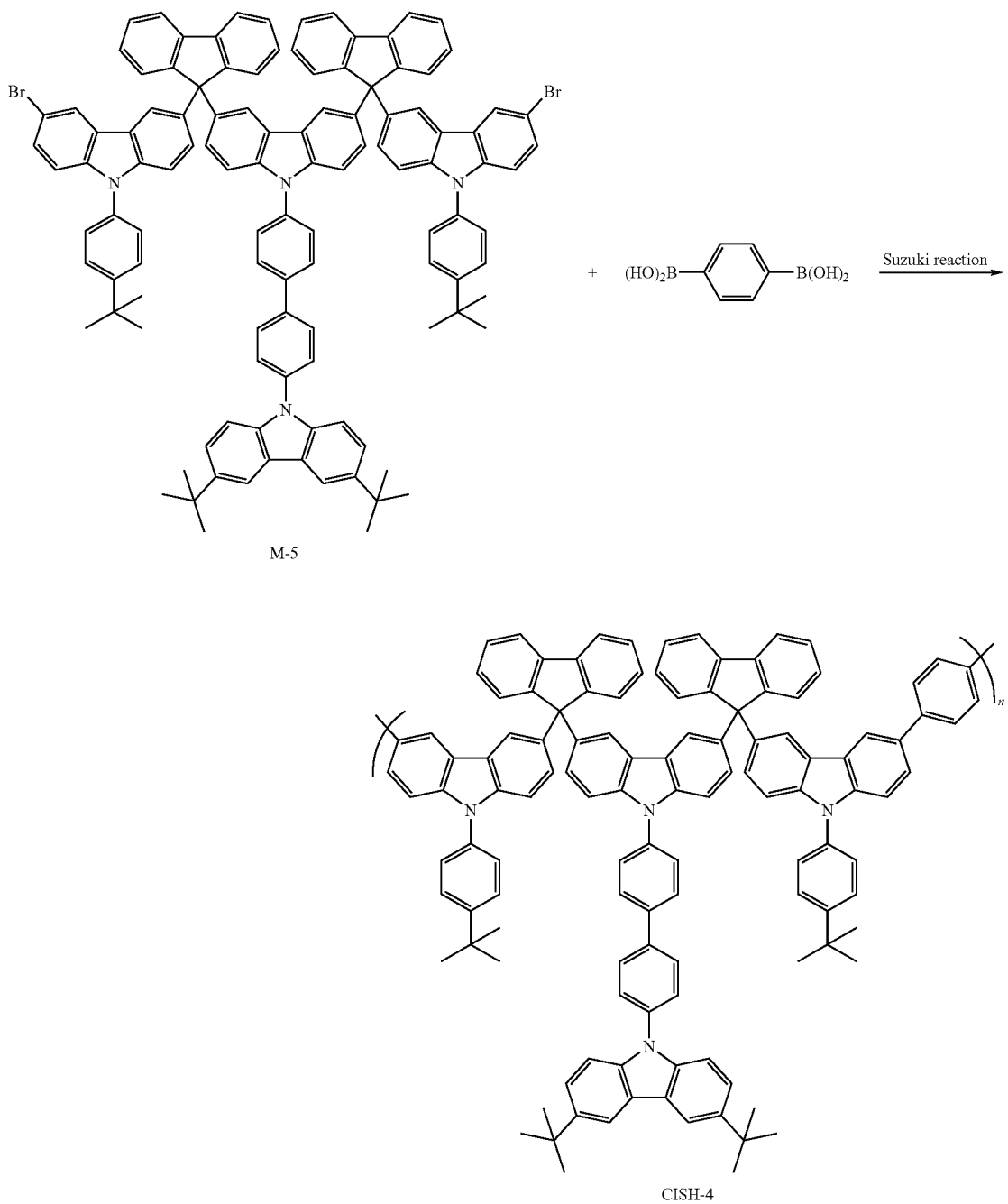

0.6 g (0.35 mmol) of the monomer M-5, 0.058 g (0.35 mmol) of 1,4-phenylene diboronic acid, and 0.05 g (0.043 mmol) of tetrakis(triphenylphosphine)palladium were dissolved in 10 mL of tetrahydrofuran in a 100 ml round flask with a thermometer, a reflux condenser, and an agitator under an argon atmosphere, and 5 mL of 20% tetraethyl ammonium hydroxide was added thereto. The resulting mixture was agitated at 75° C. for 48 hours. The agitated reactant was precipitated in methanol, obtaining a light yellow polymer. It was filtered and redissolved in chloroform, and then re-precipitated in methanol.

The re-precipitated polymer was purified for 24 hours using a Soxhlet device, obtaining 0.35 g of light yellow CISH-4.

Characteristic Evaluation of the Polymers:

The prepared CISH-1 to CISH-4 were used to form thin films on glass substrates and measured regarding PL (photoluminescence) wavelength using HITACHI F-4500®. The result of the PL wavelength measurement of CISH-1 is provided in FIG. 2.

Figure 2:
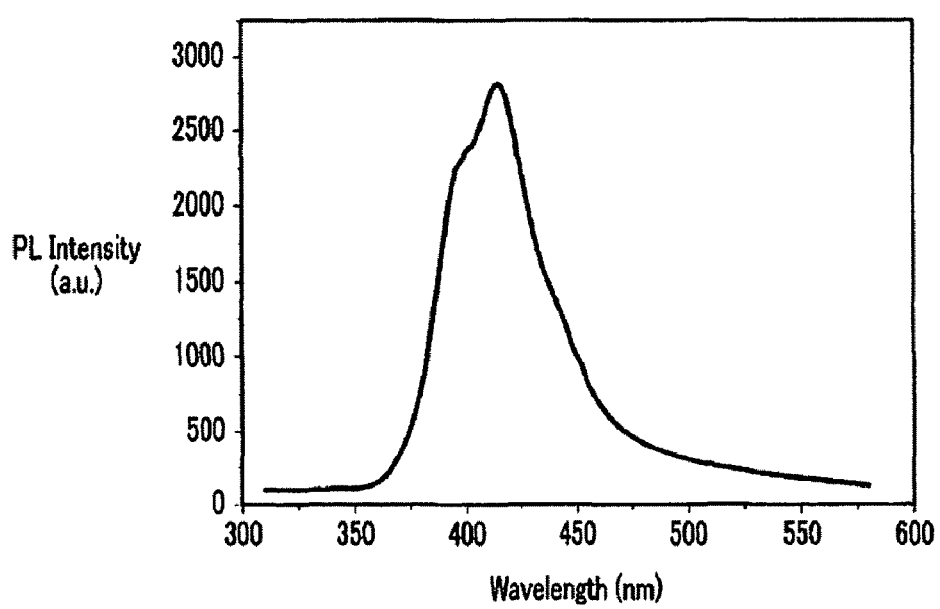
FIG. 2 illustrates a graph of the photoluminescence (PL) wavelength of the polymer according to Example 6.

Referring to FIG. 2, the thin-filmed CISH-1 had a maximum light emitting wavelength of 414 nm.

In addition, the CISH-1 of Example 6 was measured regarding $^1$H-NMR using Bruker 300 MHz®. The result is shown in FIG. 3 ($^1$H-NMR (CD$_2$Cl$_2$, δ, ppm): 8.34-7.03 (aromatic, 56H br, m); 1.5-1.12 (t-butyl, 36H)).

Figure 3:
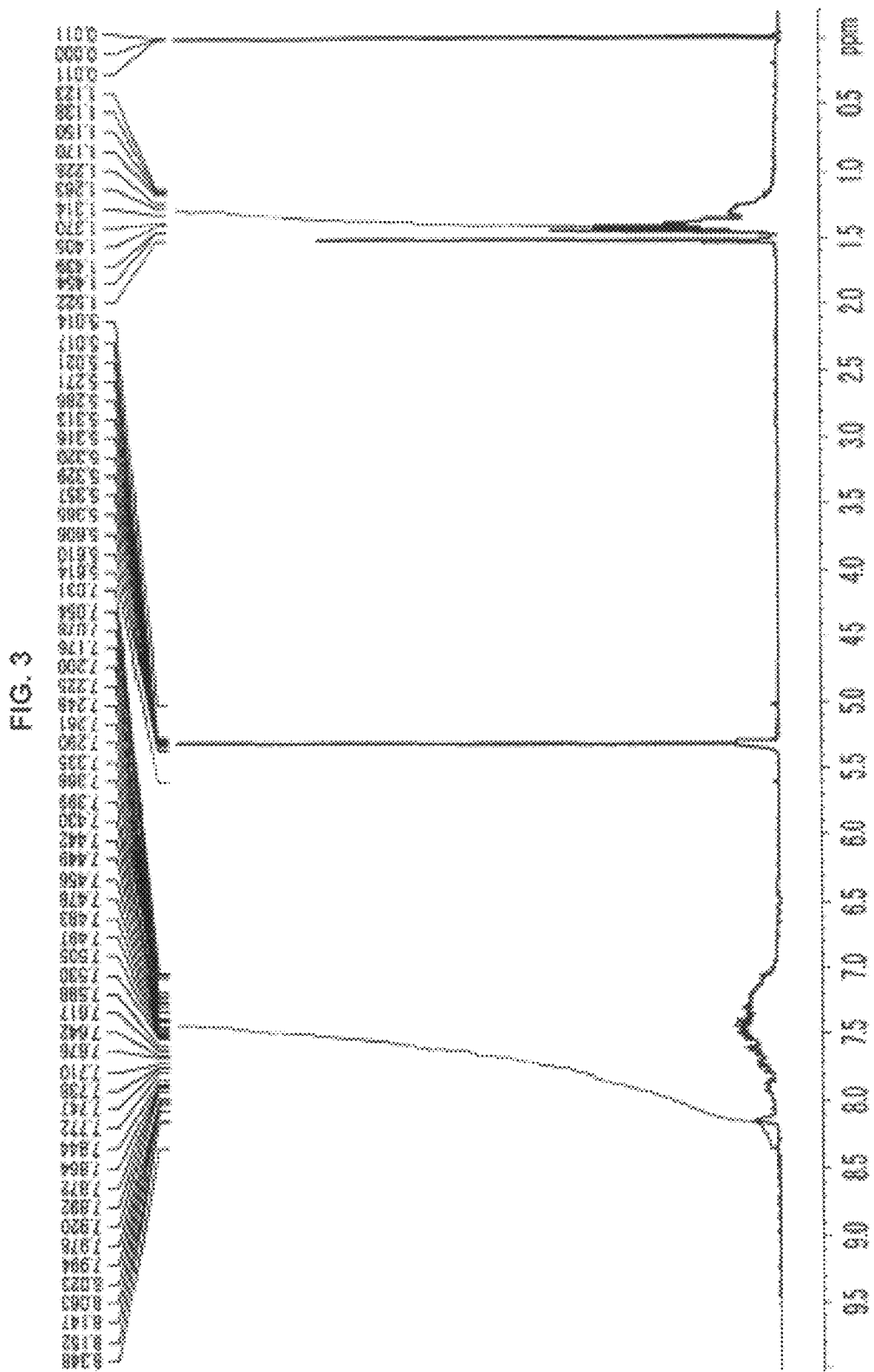
FIG. 3 illustrates a $^1$H-NMR spectrum of the organic compound according to Example 6.

Referring to FIG. 3, the polymer of Example 6 was identified as CISH-1.

Fabrication of an Organic Photoelectric Device:

An ITO substrate was used as an anode. The anode was spin-coated to form poly(3,4-ethylenedioxy-thiophene) (PEDOT) on the top thereof.

Next, an emission layer according to an embodiment was formed on the surface of the PEDOT by doping Ir(mppy)$_3$ in CISH-1 in an amount of 6 to 7%.

A 50 Å thick hole blocking layer was formed on the emission layer by vacuum-depositing BAlq.

Then, a 200 Å thick electron transport layer (ETL) was formed on the emission layer by vacuum-deposing Alq$_3$.

An organic photoelectric device was completed by sequentially vacuum-deposing 10 Å of LiF and 1000 Å of Al on the electron transport layer (ETL) to form a cathode.

The organic photoelectric device had five layers, including Al 1000 Å/LiF 10 Å/Alq$_3$ 200 Å/BAlq 50 Å/EML (CISH-1: CBP:Ir(mppy)$_3$)/PEDOT/ITO 1500 Å.

Performance Measurement of the Organic Photoelectric Device:

Each organic photoelectric device was measured regarding current density and luminance changes according to voltage change. The measurement method is as follows.

1) Measurement of Current Density Change Depending on Voltage Change:

The prepared organic photoelectric devices were increased in voltage from 0 V to 14 V and measured regarding a current value in a unit device by using a current-voltage device (Keithley 2400®). Then, their current densities were measured by dividing the current value by area.

The organic photoelectric device including the CISH-1 was measured regarding current density change depending on voltage change. The result is provided in FIG. 4.

2) Measurement of Luminance Change Depending on Voltage Change:

The organic photoelectric devices were increased in voltage from 0 V to 14 V and measured regarding luminance using a luminance meter (Minolta Cs-1000A®).

Figure 5:
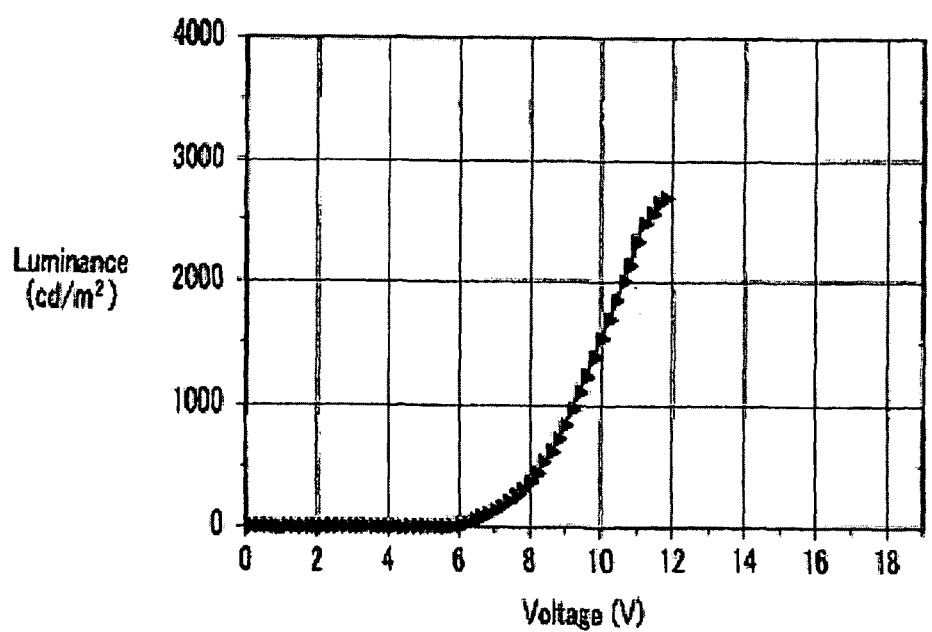
FIG. 5 illustrates a graph showing voltage-luminance of the organic photoelectric device including the polymer according to Example 6.

The luminance change result of the organic photoelectric device including the CISH-1 is shown in FIG. 5.

Figure 4:
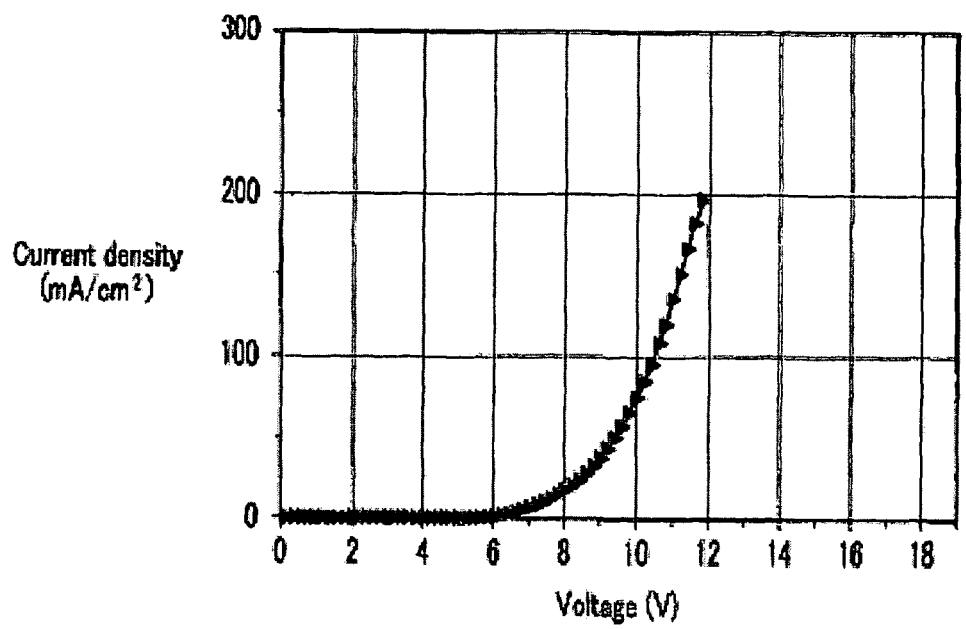
FIG. 4 illustrates a graph of current density of a organic photoelectric device including the polymer according to Example 6.

Referring to FIGS. 4 and 5, it can be seen that the CISH-1 according to an embodiment exhibits characteristics that are good for a host material for an organic photoelectric device.

As described above, embodiments may provide a polymer that easily dissolves in an organic solvent, and is applicable as, e.g., a host material of an emission layer of an organic photoelectric device. The polymer may emit fluorescence and phosphorescence at a red wavelength through a blue wavelength.

In contrast, a host material that includes 4,4-N,N-dicarbazolebiphenyl (CBP), having a glass transition temperature of 110° C. or less and a thermal decomposition temperature of 400° C. or less, may have a thermal stability that is low and symmetry that is excessively high. Further, it may tend to crystallize and cause problems such as a short and a pixel defect according to results of thermal resistance tests of the devices. In addition, host materials including CBP may be materials in which the hole transporting property is greater than the electron transporting property. Thus, as the injected hole transportation is faster than the injected electron transportation, the excitons may be ineffectively formed in the emission layer. Therefore, the resultant device may have low luminous efficiency.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A polymer represented by the following Chemical Formula 1:

[Chemical Formula 1]

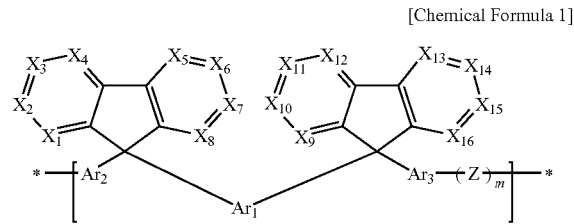

wherein, in Chemical Formula 1,

X$_1$ to X$_{16}$ are independently CR' or N, where R' is hydrogen, a halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a substituted or unsubstituted C6 to C20 aryloxy, a substituted or unsubstituted C2 to C20 heterooxy, a substituted or unsubstituted C3 to C40 silyloxy, a substituted or unsubstituted C1 to C20 acyl, a substituted or unsubstituted C2 to C20 alkoxy carbonyl, a substituted or unsubstituted C2 to C20 acyloxy, a substituted or unsubstituted C2 to C20 acylamino, a substituted or unsubstituted C2 to C20 alkoxy carbonyl amino, a substituted or unsubstituted C7 to C20 aryloxy carbonyl amino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 arylthiol, a substituted or unsubstituted C1 to C20 hetero cycloalkyl thiol, a substituted or unsubstituted C1 to C20 ureide, a substituted or unsubstituted C1 to C20 phosphoric acid amide, or a substituted or unsubstituted C3 to C40 silyl, Ar₁ to Ar₃, and Z are independently a substituted or unsubstituted C6 to C30 arylene, or a substituted or unsubstituted C2 to C30 heteroarylene, and m is an integer ranging from 0 to 4.

2. The polymer as claimed in claim 1, wherein Ar₁ to Ar₃ are independently a substituted or unsubstituted carbazolene, a substituted or unsubstituted aryleneamine, a substituted or unsubstituted phenylene, a substituted or unsubstituted tolylene, a substituted or unsubstituted naphthylene, a substituted or unsubstituted stilbenylene, a substituted or unsubstituted fluorenylene, a substituted or unsubstituted anthracenylene, a substituted or unsubstituted terphenylene, a substituted or unsubstituted pyrenylene, a substituted or unsubstituted diphenylanthracenylene, a substituted or unsubstituted dinaphthylanthracenylene, a substituted or unsubstituted pentacenylene, a substituted or unsubstituted bromophenylene, a substituted or unsubstituted hydroxyphenylene, a substituted or unsubstituted thienylene, a substituted or unsubstituted pyridylene, a substituted or unsubstituted azobenzenylene, or a substituted or unsubstituted ferrocenylene.

3. The polymer as claimed in claim 1, wherein Z is a substituted or unsubstituted phenylene, a substituted or unsubstituted naphthylene, a substituted or unsubstituted anthracenylene, a substituted or unsubstituted fluorenylene, a substituted or unsubstituted thiophene, a substituted or unsubstituted pyrrolene, a substituted or unsubstituted pyridinylene, a substituted or unsubstituted aryloxadiazolene, a substituted or unsubstituted triazolene, a substituted or unsubstituted carbazolene, a substituted or unsubstituted aryleneamine, or a substituted or unsubstituted arylenesilane.

4. The polymer as claimed in claim 1, wherein Z is selected from compounds represented by the following Chemical Formulae 2 to 22:

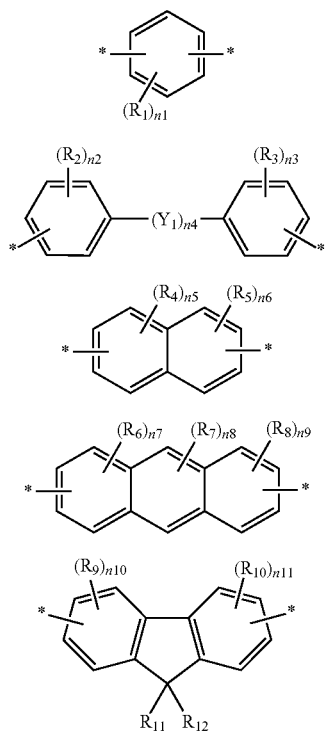

[Chemical Formula 2]

[Chemical Formula 3]

[Chemical Formula 4]

[Chemical Formula 5]

[Chemical Formula 6]

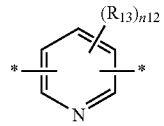

[Chemical Formula 7]

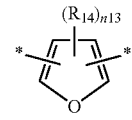

[Chemical Formula 8]

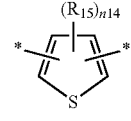

[Chemical Formula 9]

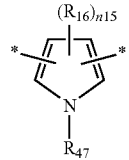

[Chemical Formula 10]

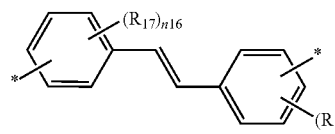

[Chemical Formula 11]

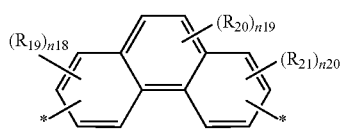

[Chemical Formula 12]

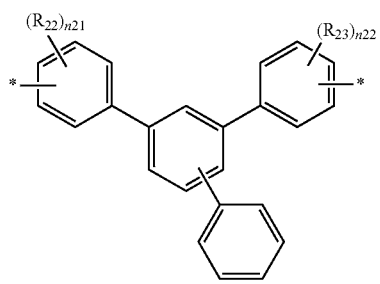

[Chemical Formula 13]

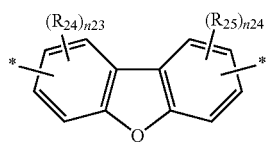

[Chemical Formula 14]

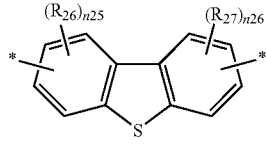

[Chemical Formula 15]

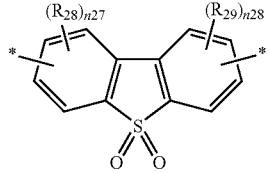

[Chemical Formula 16]

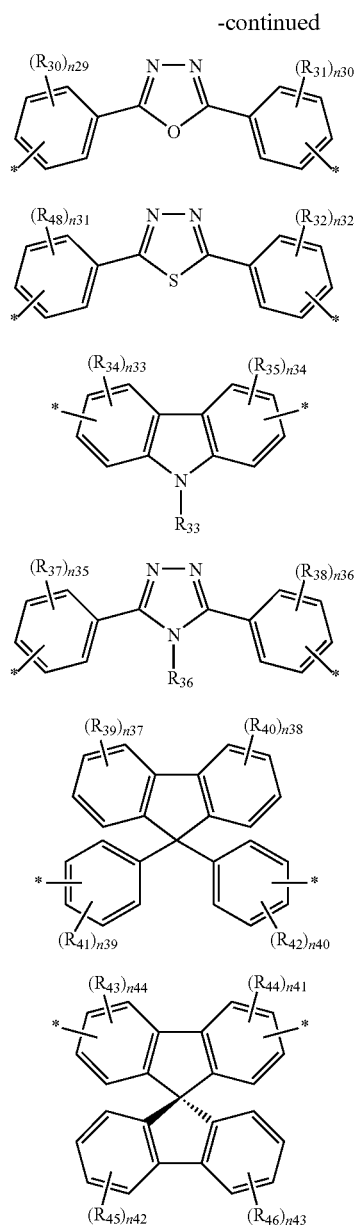

stituted or unsubstituted C6 to C20 aryloxy, a substituted or unsubstituted C2 to C20 heterooxy, a substituted or unsubstituted C3 to C40 silyl oxy, a substituted or unsubstituted C1 to C20 acyl, a substituted or unsubstituted C2 to C20 alkoxy carbonyl, a substituted or unsubstituted C2 to C20 acyl oxy, a substituted or unsubstituted C2 to C20 acyl amino, a substituted or unsubstituted C2 to C20 alkoxy carbonyl amino, a substituted or unsubstituted C7 to C20 aryl oxycarbonylamino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 aryl thiol, a substituted or unsubstituted C1 to C20 hetero cyclo alkyl thiol, a substituted or unsubstituted C1 to C20 ureide, a substituted or unsubstituted C1 to C20 phosphoric acid amide, or a substituted or unsubstituted C3 to C40 silyl, $Y_1$ is a single bond, O, S, NR", SiR"R'", or CR"R", where R" and R'" are independently hydrogen, a halogen, a cyano, a hydroxyl, an amino, a nitro, a carboxyl, a substituted or unsubstituted C1 to C20 alkyl, a substituted or unsubstituted C6 to C30 aryl, or a substituted or unsubstituted C2 to C30 heteroaryl, $n_{42}$ and $n_{43}$ are independently integers ranging from 0 to 5, $n_1$ to $n_3$, $n_{16}$, $n_{17}$, $n_{21}$, $n_{22}$, $n_{29}$, $n_{30}$ to $n_{32}$, $n_{35}$ to $n_{38}$, $n_{39}$, and $n_{40}$ are independently integers ranging from 0 to 4, $n_5$, $n_6$, $n_7$, $n_9$, $n_{10}$ to $n_{12}$, $n_{18}$, $n_{20}$, $n_{23}$ to $n_{28}$, $n_{33}$, $n_{34}$, $n_{41}$, and $n_{44}$ are independently integers ranging from 0 to 3, $n_8$, $n_{13}$ to $n_{15}$, and $n_{19}$ are independently integers ranging from 0 to 2, and $n_4$ is 0 or 1.

5. The polymer as claimed in claim 1, wherein the polymer has weight average molecular weight of about 1000 to about 5,000,000.

6. The polymer as claimed in claim 1, wherein the polymer has number average molecular weight of about 500 to about 2,000,000.

7. An organic photoelectric device, comprising:
an organic layer between a pair of electrodes,
wherein the organic layer includes the polymer as claimed in claim 1.

8. The organic photoelectric device as claimed in claim 7, wherein the organic layer is an emission layer.

9. The organic photoelectric device as claimed in claim 8, wherein the polymer is a host in the emission layer.

10. The organic photoelectric device as claimed in claim 7, wherein the organic layer is a hole injection layer (HIL), a hole transport layer (HTL), a hole blocking layer, or a combination thereof.

11. The organic photoelectric device as claimed in claim 7, wherein the organic layer is an electron injection layer (EIL), an electron transport layer (ETL), an electron blocking layer, or a combination thereof.

12. A polymer represented by one of the following Chemical Formulae 23 to 28:

wherein, in Chemical Formulae 2 to 22, $R_1$ to $R_{48}$ are independently a halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a sub-

[Chemical Formula 23]

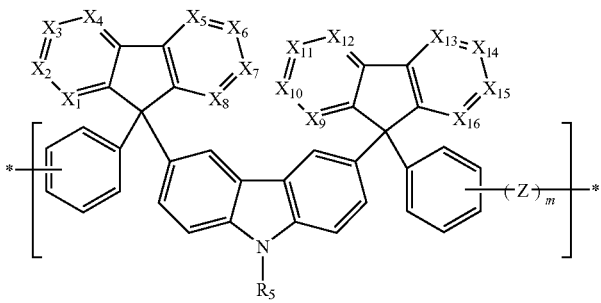

-continued
[Chemical Formula 24]
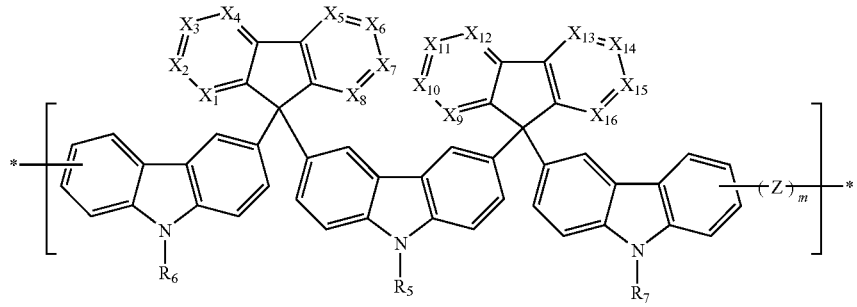
[Chemical Formula 25]
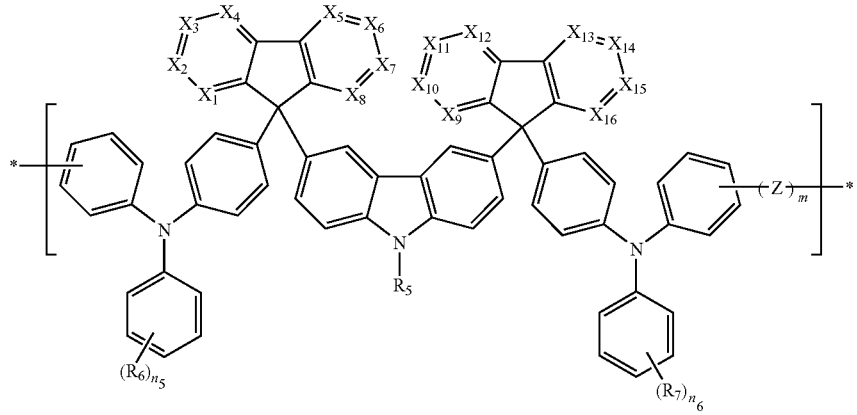
[Chemical Formula 26]
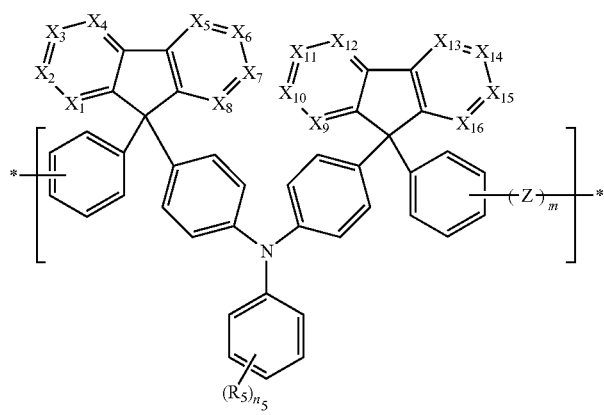
[Chemical Formula 27]
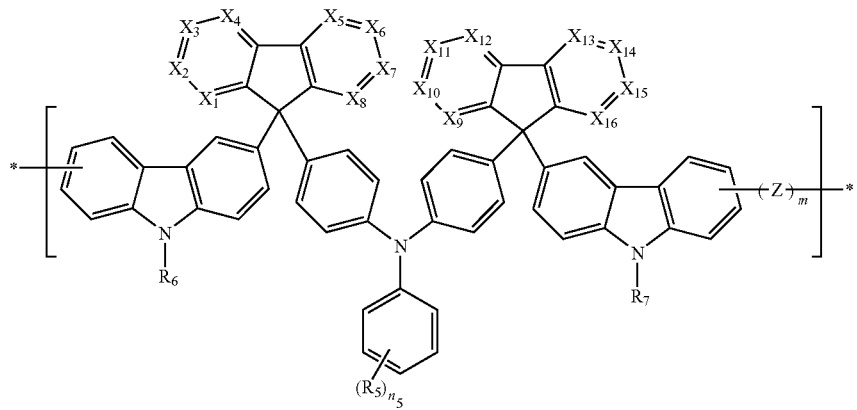

[Chemical Formula 28]

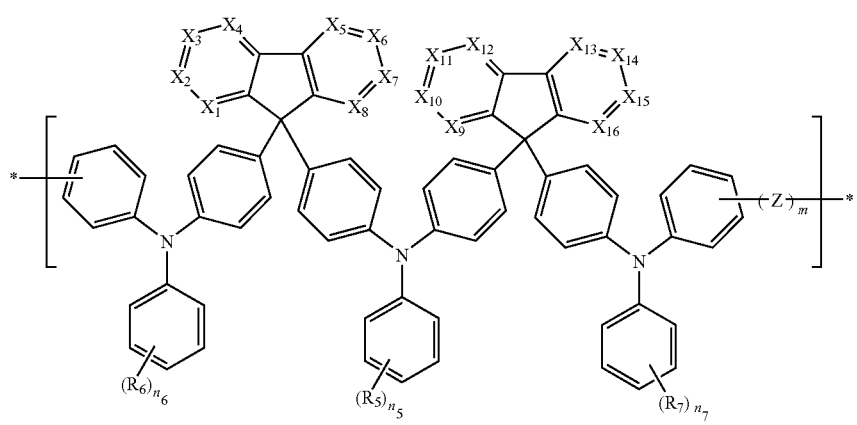

wherein, in Chemical Formulae 23 to 28, $X_1$ to $X_{16}$ are independently CR' or N, Z is a substituted or unsubstituted C6 to C30 arylene, or a substituted or unsubstituted C2 to C30 heteroarylene, $R_5$ to $R_7$ and R' are independently hydrogen, a halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a substituted or unsubstituted C6 to C20 aryloxy, a substituted or unsubstituted C2 to C20 heterooxy, a substituted or unsubstituted C3 to C40 silyloxy, a substituted or unsubstituted C1 to C20 acyl, a substituted or unsubstituted C2 to C20 alkoxy carbonyl, a substituted or unsubstituted C2 to C20 acyloxy, a substituted or unsubstituted C2 to C20 acylamino, a substituted or unsubstituted C2 to C20 alkoxy carbonyl amino, a substituted or unsubstituted C7 to C20 aryloxy carbonyl amino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 arylthiol, a substituted or unsubstituted C1 to C20 hetero cycloalkyl thiol, a substituted or unsubstituted C1 to C20 ureide, a substituted or unsubstituted C1 to C20 phosphoric acid amide, or a substituted or unsubstituted C3 to C40 silyl, $n_5$ to $n_7$ are integers ranging from 0 to 5, and m is an integer ranging from 0 to 4.

13. The polymer as claimed in claim 12, wherein Z is a substituted or unsubstituted phenylene, a substituted or unsubstituted naphthylene, a substituted or unsubstituted anthracenylene, a substituted or unsubstituted fluorenylene, a substituted or unsubstituted thiophenylene, a substituted or unsubstituted pyrrolene, a substituted or unsubstituted pyridinylene, a substituted or unsubstituted aryloxadiazolene, a substituted or unsubstituted triazolene, a substituted or unsubstituted carbazolene, a substituted or unsubstituted aryleneamine, or a substituted or unsubstituted arylenesilane.

14. The polymer as claimed in claim 12, wherein Z is selected from compounds represented by the following Chemical Formulae 2 to 22:

[Chemical Formula 2]

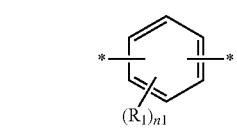

[Chemical Formula 3]

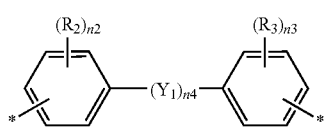

[Chemical Formula 4]

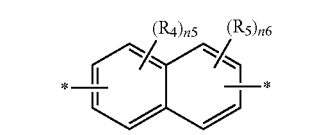

[Chemical Formula 5]

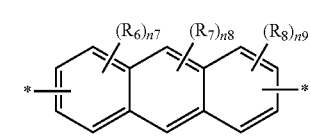

[Chemical Formula 6]

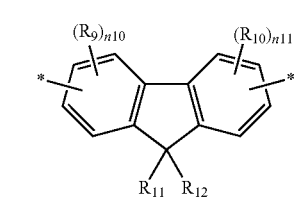

[Chemical Formula 7]

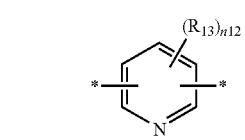

[Chemical Formula 8]

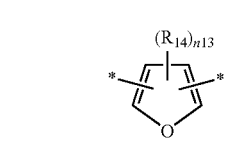

[Chemical Formula 9]

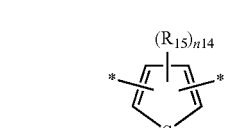

-continued

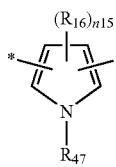
[Chemical Formula 10]

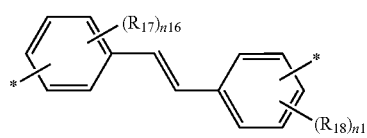
[Chemical Formula 11]

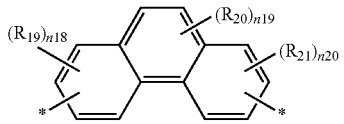
[Chemical Formula 12]

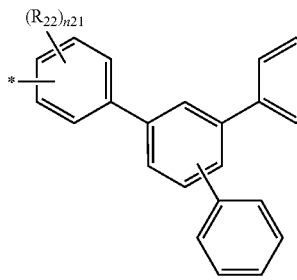
[Chemical Formula 13]

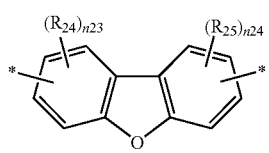
[Chemical Formula 14]

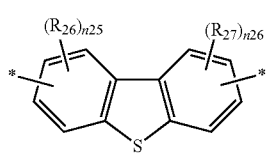
[Chemical Formula 15]

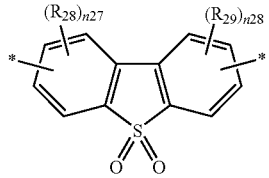
[Chemical Formula 16]

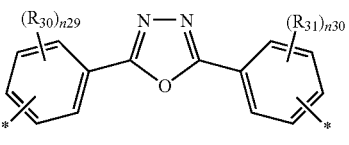
[Chemical Formula 17]

[Chemical Formula 18]

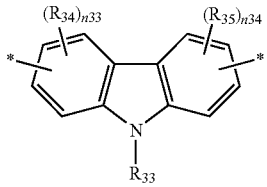
[Chemical Formula 19]

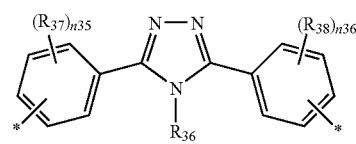
[Chemical Formula 20]

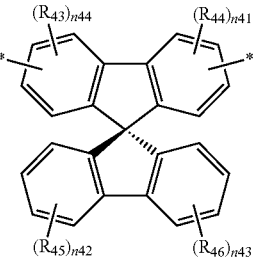
[Chemical Formula 21]

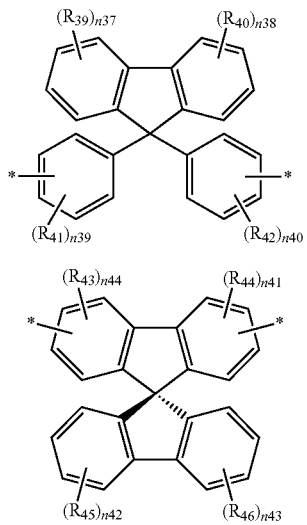
[Chemical Formula 22]

wherein, in Chemical Formulae 2 to 22, $R_1$ to $R_{48}$ are independently a halogen, a cyano, a hydroxyl, an amino, a nitro, a carboxyl, a substituted or unsubstituted C1 to C20 alkyl, a substituted or unsubstituted C2 to C20 alkenyl, a substituted or unsubstituted C6 to C30 aryl, a substituted or unsubstituted C2 to C30 heteroaryl, a substituted or unsubstituted C1 to C20 alkoxy, a substituted or unsubstituted C6 to C20 aryloxy, a substituted or unsubstituted C2 to C20 heterooxy, a substituted or unsubstituted C3 to C40 silyl oxy, a substituted or unsubstituted C1 to C20 acyl, a substituted or unsubstituted C2 to C20 alkoxy carbonyl, a substituted or unsubstituted C2 to C20 acyl oxy, a substituted or unsubstituted C2 to C20 acyl amino, a substituted or unsubstituted C2 to C20 alkoxy carbonyl amino, a substituted or unsubstituted C7 to C20 aryl oxycarbonylamino, a substituted or unsubstituted C1 to C20 sulfamoyl amino, a substituted or unsubstituted C1 to C20 sulfonyl, a substituted or unsubstituted C1 to C20 alkylthiol, a substituted or unsubstituted C6 to C20 aryl thiol, a substituted or unsubstituted C1 to C20 hetero cyclo alkyl thiol, a substituted or unsubstituted C1 to C20 ureide, a substituted or unsubstituted C1 to C20 phosphoric acid amide, or a substituted or unsubstituted C3 to C40 silyl, $Y_1$ is a single bond, O, S, NR", SiR"R'", or CR"R'", where R" and R'" are independently selected from the group consisting of hydrogen, a halogen, a cyano, a hydroxyl, an amino, a nitro, a carboxyl, a substituted or unsubstituted C1 to C20 alkyl, a substituted or unsubstituted C6 to C30 aryl, and a substituted or unsubstituted C2 to C30 heteroaryl, $n_{42}$ and $n_{43}$ are independently integers ranging from 0 to 5, $n_1$ to $n_3$, $n_{16}$, $n_{17}$, $n_{21}$, $n_{22}$, $n_{29}$, $n_{30}$ to $n_{32}$, $n_{35}$ to $n_{38}$, $n_{39}$, and $n_{40}$ are independently integers ranging from 0 to 4, $n_5$, $n_6$, $n_7$, $n_9$, $n_{10}$ to $n_{12}$, $n_{18}$, $n_{20}$, $n_{23}$ to $n_{28}$, $n_{33}$, $n_{34}$, $n_{41}$, and $n_{44}$ are independently integers ranging from 0 to 3, $n_8$, $n_{13}$ to $n_{15}$, and $n_{19}$ are independently integers ranging from 0 to 2, and $n_4$ is 0 or 1.

* * * * *